US012718165B2

(12) United States Patent
O'Herlihy et al.

(10) Patent No.: US 12,718,165 B2
(45) Date of Patent: Aug. 25, 2026

(54) SYSTEM AND METHOD FOR MAPPING RISKS IN A WAREHOUSE ENVIRONMENT

(71) Applicant: Everseen Limited, Blackpool (IE)

(72) Inventors: Alan O'Herlihy, Glenville (IE); Joe Allen, Ballybunion (IE); Dan Alexandru Pescaru, Timisoara (RO)

(73) Assignee: Everseen Limited, Blackpool (IE)

( * ) Notice: Subject to any disclaimer, the term of this patent is extended or adjusted under 35 U.S.C. 154(b) by 178 days.

(21) Appl. No.: 17/888,752

(22) Filed: Aug. 16, 2022

(65) Prior Publication Data

US 2022/0391796 A1 Dec. 8, 2022

Related U.S. Application Data

(63) Continuation-in-part of application No. 16/991,210, filed on Aug. 12, 2020, now abandoned.

(51) Int. Cl.
*H04N 7/18* (2006.01)
*G06Q 10/0635* (2023.01)
(Continued)

(52) U.S. Cl.
CPC ......... *G06Q 10/0635* (2013.01); *G06Q 10/08* (2013.01); *G06V 20/41* (2022.01); *G06V 20/48* (2022.01); *H03H 17/0257* (2013.01)

(58) Field of Classification Search
CPC .... G06Q 10/0635; G06Q 10/08; G06V 20/41; G06V 20/48; H03H 17/0257
See application file for complete search history.

(56) References Cited

U.S. PATENT DOCUMENTS

| | | | |
|---|---|---|---|
| 7,483,917 | B2 | 1/2009 | Sullivan et al. |
| 9,185,359 | B1 | 11/2015 | McGee et al. |

(Continued)

FOREIGN PATENT DOCUMENTS

| | | | |
|---|---|---|---|
| CN | 101067744 | A | 11/2007 |
| CN | 206620222 | U | 11/2017 |

(Continued)

OTHER PUBLICATIONS

Simonyan, Karen, and Andrew Zisserman. "Very deep convolutional networks for large-scale image recognition." arXiv preprint arXiv:1409.1556 (2014).

(Continued)

*Primary Examiner* — Talia F Crawley
(74) *Attorney, Agent, or Firm* — Conley Rose, P.C.

(57) ABSTRACT

A system and method for identifying risk in warehouse environments includes video sensors configured to capture video streams and a central processing unit communicatively coupled to video sensors. The central processing unit is configured with an emerging risk discovery unit configured to detect a current risk subject in the obtained plurality of real time video frames. Further, the plurality of real time video frames are stored in a memory. A location of the current risk subject detected in the obtained plurality of real time video frames is detected. Further, physical characteristics of current risk subject for predicting one or more actions performed by the current risk subject are estimated, and actions and location of the current risk subject are processed to detect patterns or movements and activities undertaken by one or more risk subjects.

20 Claims, 11 Drawing Sheets

(51) Int. Cl.

| | |
|---|---|
| ***G06Q 10/08*** | (2023.01) |
| ***G06V 20/40*** | (2022.01) |
| ***H03H 17/02*** | (2006.01) |
| ***H04L 29/06*** | (2006.01) |

(56) References Cited

U.S. PATENT DOCUMENTS 9,256,944 B2 2/2016 Galera et al.
9,380,275 B2 6/2016 Davidson, Jr. et al.
10,021,138 B2* 7/2018 Gill .................... H04L 63/1416
10,282,720 B1 5/2019 Buibas et al.
10,282,852 B1 5/2019 Buibas et al.
10,373,322 B1 8/2019 Buibas et al.
10,445,944 B2 10/2019 Galera et al.
10,474,988 B2 11/2019 Fisher et al.
10,496,827 B1 12/2019 Ridner et al.
10,535,146 B1 1/2020 Buibas et al.
10,586,208 B2 3/2020 Buibas et al.
10,684,623 B2 6/2020 Tiwari et al.
11,113,825 B2 9/2021 Buibas et al.
11,120,690 B2 9/2021 Gunther et al.
2004/0102869 A1* 5/2004 Andersen .............. B65H 18/28
700/215
2014/0055612 A1* 2/2014 Hinkel ............ G08B 13/19656
348/143
2014/0278734 A1 9/2014 Mather et al.
2014/0313077 A1* 10/2014 Kubrak .................. G01S 19/20
342/357.58
2015/0066550 A1* 3/2015 Harada ............... G06Q 10/063
705/7.11
2015/0281287 A1* 10/2015 Gill .................... H04L 63/1416
726/1
2016/0117635 A1 4/2016 Parker et al.
2018/0253567 A1* 9/2018 Gonzalez-Banos .........................
H04N 21/8358
2019/0235511 A1 8/2019 Tiwari et al.
2019/0369642 A1 12/2019 Watabe et al.
2020/0042921 A1* 2/2020 Itou ....................... G06Q 10/06
2020/0098270 A1 3/2020 Gunther et al.
2020/0206928 A1* 7/2020 Denenberg ............. G01S 17/04

FOREIGN PATENT DOCUMENTS

CN 110772177 A 2/2020
EP 2947604 A1 11/2015
EP 3482887 A1 5/2019
EP 3627386 A1 3/2020
JP 2006155423 A 6/2006
WO 2020018585 A1 1/2020

OTHER PUBLICATIONS

He, K., Zhang, X., Ren, S., Sun, J., "Deep residual learning for image recognition." arXiv:1512.03385 (2015).

* cited by examiner

SYSTEM AND METHOD FOR MAPPING RISKS IN A WAREHOUSE ENVIRONMENT

CROSS REFERENCE TO RELATED APPLICATIONS

This application is a Continuation-In-Part of U.S. patent application Ser. No. 16/991,210 filed on 12 Aug. 2020, the entirety of which is incorporated herein.

TECHNICAL FIELD

The present disclosure relates generally to a warehouse or distribution environment, and more specifically to improving the efficiency of warehouse management by identifying and documenting areas of greatest risk.

BACKGROUND

In a distribution system, order fulfillment is a key process in managing the supply chain. It includes generating, filling, delivering and servicing customer orders. A typical order fulfillment process includes various sub-processes such as receiving order, picking an order, packing an order, and shipping the order. Receiving refers to the acceptance and storage of incoming inventory at a fulfillment center. When the fulfillment center receives the inventory, the items may be stored in dedicated warehouse locations, such as pallets. A pallet is a portable, rigid platform that is flat and can carry the load. In the picking sub-process, the picking team receives a packing slip with the items, quantities, and storage locations at the facility to collect the ordered products from their respective pallets.

Also, two features influence the operational efficiency of a warehouse or distribution centre. These aspects relate to the dynamic nature of the warehouse environment, and the performance of human operators during a pallet handling/order-picking process. In view of the above, there is a need for addressing the problem of order fulfillment efficiency in a warehouse distribution system, and enabling better operational management by redesigning package handling routes, and optimisation of package handling procedures during order fulfilment.

SUMMARY

In an aspect of the present disclosure, there is provided a system for identifying and managing areas of risk in a warehouse environment. The system may include one or more video sensors configured to capture one or more video streams thereof, to generate one or more monitored zones, and one or more uncovered zones in the warehouse environment, based on the Field of View of the one or more video sensors. The system may further include a central processing unit communicatively coupled to the one or more video sensors. The central processing unit includes a raw risk information collection unit configured to store information captured by the one or more video sensors, and a processing and aggregating unit configured to process and aggregate the one or more video streams to produce risk identification information associated with an Operator Route traversed by a warehouse operator while performing a warehouse operation, wherein the risk identification information includes at least one risk zone, and corresponding risk type, and risk level, wherein a risk zone is an area in the warehouse environment that corresponds to one or more risk instances. The system may further include a risk map generation unit configured to generate a Warehouse Risk Map based on the risk identification information, wherein the Warehouse Risk Map is generated by superimposing an identified risk zone on a warehouse map. The system may further include a risk map updating unit for updating the Warehouse Risk Map in real-time when at least one of the risk type, risk level, and risk zone changes for at least one risk instance recorded on the Warehouse Risk Map.

In another aspect of the present disclosure, there is provided a method for identifying and managing areas of risk in a warehouse environment. The method includes capturing one or more video streams thereof, to generate one or more monitored zones, and one or more uncovered zones in the warehouse environment, based on the Field of View of the one or more video sensors. The method may further include storing information captured by the one or more video sensors. The method may further include processing and aggregating the one or more video streams to produce risk identification information associated with an Operator Route traversed by a warehouse operator while performing a warehouse operation, wherein the risk identification information includes at least one risk zone, and corresponding risk type, and risk level, wherein a risk zone is an area in the warehouse environment that corresponds to one or more risk instances. The method may further include generating a Warehouse Risk Map based on the risk identification information, wherein the Warehouse Risk Map is generated by superimposing an identified risk zone on a warehouse map. The method may further include updating the Warehouse Risk Map in real-time when at least one of the risk type, risk level, and risk zone changes for at least one risk instance recorded on the Warehouse Risk Map.

In yet another aspect of the present disclosure, there is provided a computer programmable product for identifying and managing areas of risk in a warehouse environment, the computer programmable product comprising a set of instructions. The set of instructions when executed by a processor causes the processor to capture one or more video streams thereof, to generate one or more monitored zones, and one or more uncovered zones in the warehouse environment, based on the Field of View of the one or more video sensors, store information captured by the one or more video sensors, process and aggregate the one or more video streams to produce risk identification information associated with an Operator Route traversed by a warehouse operator while performing a warehouse operation, wherein the risk identification information includes at least one risk zone, and corresponding risk type, and risk level, wherein a risk zone is an area in the warehouse environment that corresponds to one or more risk instances, generate a Warehouse Risk Map based on the risk identification information, wherein the Warehouse Risk Map is generated by superimposing an identified risk zone on a warehouse map, and update the Warehouse Risk Map in real-time when at least one of the risk type, risk level, and risk zone changes for at least one risk instance recorded on the Warehouse Risk Map.

Various embodiments of the present disclosure perform analysis of known and observed potentially changing environmental and human risk factors to generate and update a spatially defined risk map in a warehouse environment. By relating risk factor information to spatial information, the present disclosure allows causative correlations to be drawn between observed performance variables and specific locations within the warehouse environment or areas proximal thereto. The risk map may be used to detect and identify current and future potential performance impacting problems that include, but are not limited to, rack areas of less accessibility for order pickers, for example, where items are stacked at the back of the rack space, or stacked too high in the rack space, spillage areas, poorly illuminated areas, areas where products of awkward size of shape are more likely to be stacked, or stacked badly, areas where order pickers are more likely to slow down, and areas of greater security risk. Also, the risk map is updated frequently and potentially in real-time to enable speedy adaptation to rapidly changing risk factors, to minimise the damaging effects of rapidly evolving scenarios. Thus, insights obtained from the risk map may be used to improve the warehouse environment design, to increase the operational efficiency and to implement automatic detectors that are able to trigger alarms when an incident happens.

It will be appreciated that features of the present disclosure are susceptible to being combined in various combinations without departing from the scope of the present disclosure as defined by the appended claims.

BRIEF DESCRIPTION OF THE DRAWINGS

The summary above, as well as the following detailed description of illustrative embodiments, is better understood when read in conjunction with the appended drawings. For the purpose of illustrating the present disclosure, exemplary constructions of the disclosure are shown in the drawings. However, the present disclosure is not limited to specific methods and instrumentalities disclosed herein. Moreover, those in the art will understand that the drawings are not to scale. Wherever possible, like elements have been indicated by identical numbers.

In the accompanying drawings, an underlined number is employed to represent an item over which the underlined number is positioned or an item to which the underlined number is adjacent. A non-underlined number relates to an item identified by a line linking the non-underlined number to the item. When a number is non-underlined and accompanied by an associated arrow, the non-underlined number is used to identify a general item at which the arrow is pointing.

DETAILED DESCRIPTION OF ILLUSTRATIVE EMBODIMENTS

The following detailed description illustrates embodiments of the present disclosure and ways in which they can be implemented. Although the best mode of carrying out the present disclosure has been disclosed, those skilled in the art would recognize that other embodiments for carrying out or practicing the present disclosure are also possible.

Figure 1:
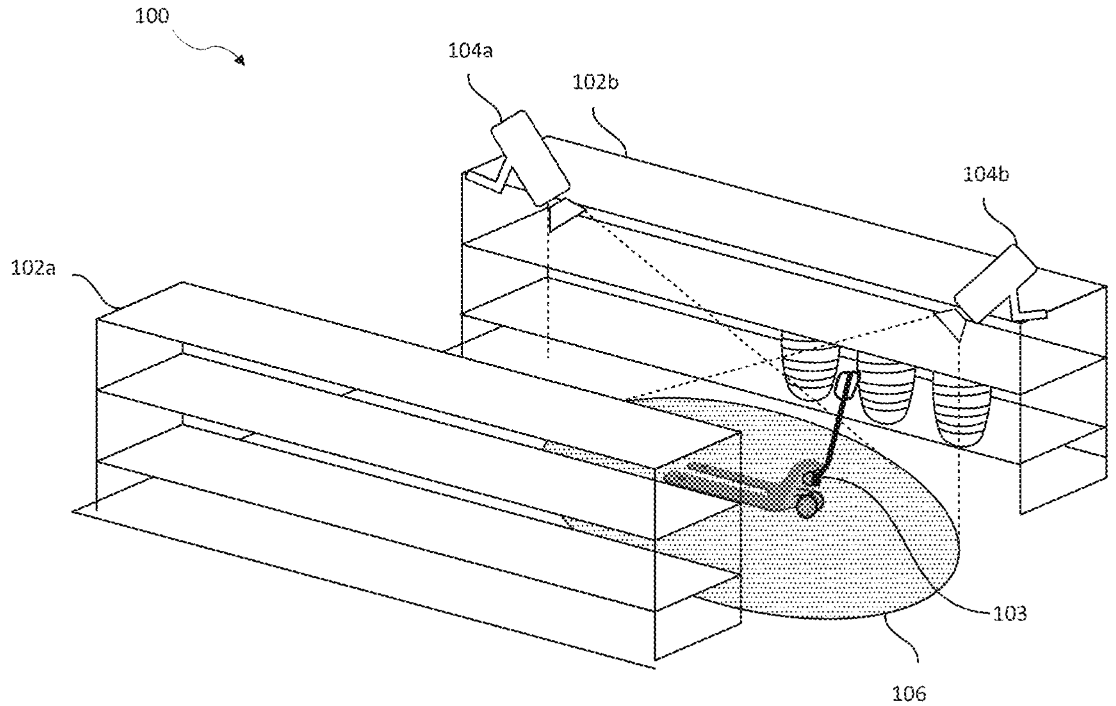
FIG. 1 illustrates a warehouse environment, wherein various embodiments of the present invention can be practiced.

FIG. 1 illustrates a warehouse environment 100, wherein various embodiments of the present invention can be practiced.

The warehouse environment 100 includes first and second storage racks 102*a* and 102*b*, and a trolley 103 for transporting goods in the warehouse environment 100. Although, two storage racks are shown herein, it would be apparent to one of skill in the art, that the warehouse environment 100 may include more than two racks and trolley.

The warehouse environment 100 may further include first and second video sensors 104*a* and 104*b* fixedly mounted over the first and second racks 102*a* and 102*b* respectively. Example of the video sensors 104*a* and 104*b* includes, but is not limited to, video cameras. The first and second video sensors 104*a* and 104*b* has a Field of View 106 that corresponds to a spatial volume in which the presence of objects may be detected in the absence of obstructions that would otherwise conceal the object. In the context of the present disclosure, the Field of View 106 also covers an Operator Route, where the Operator Route is defined as the path traversed by a warehouse operator during a task period, and the task period is defined as the time period extending from the moment the operator receives a task list from the supervisor until she/he has finished all the tasks on the task list. It should be noted that a task on the task list may include multiple operations such as a handling, order-filling, pallet-loading/unloading, and rack-filling.

The operational efficiency of the warehouse environment 100 is dependent on the dynamic nature of the warehouse environment 100, and the performance of human operators during a pallet handling/order-picking process. A variety of factors influence the pallet handing/order-picking process. These factors are hereinafter referred to as risks.

The incidence of specific types of risks may be monitored in different locations of the warehouse environment 100, according to parameters such as the time/date of the risk incidents or the identity of the operator or the forklift truck etc. The video sensors 104*a* and 104*b* may provide more detailed information regarding an operator or the type of handled packages involved in a given risk incident. This may assist warehouse managers in detecting and identifying patterns in risk incidents, for example a warehouse operator A may be more likely to spill items from a pallet close to the first rack 102*a*, thereby enabling the warehouse managers to undertake appropriate remedial action. The remedial actions may include, but not limited to, improving the lighting close to a rack where lot of risk incidents occur, increasing the spacing between racks or between racks and walls, providing additional training to particular warehouse operators about lifting or stacking items into racks or onto pallets, changing policy regarding the stacking of heavy or large items on different (higher/lower) rack spaces etc.

The individual risks may be expressed as risk instances. A risk instance comprises the following attributes: the classification of the risk, the one or more zones in the warehouse environment 100 where the relevant risk could happen (thereby enabling localization of the risk instance), and the risk level (the probability of the risk occurring in the or each relevant zone). For brevity, the one or more zones in the warehouse environment 100 where a risk could happen may be referred to henceforth as risk zones.

Figure 2A:
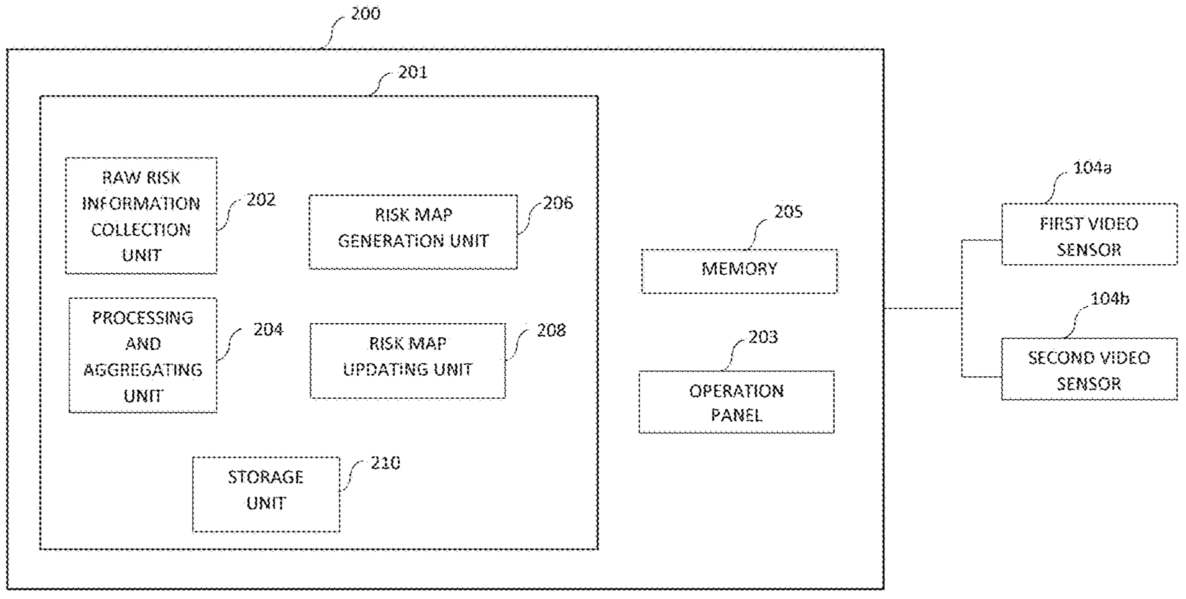
FIG. 2A illustrates a central processing unit for managing the warehouse environment, in accordance with an embodiment of the present disclosure.

FIG. 2A illustrates a system 200 for managing and monitoring the warehouse environment by identifying and documenting areas of risk, in accordance with an embodiment of the present disclosure.

The system 200 is connected to the first and second video sensors 104*a* and 104*b* through a wired or wireless communication network (not shown) to process video streams recorded by the video sensors 104*a* and 104*b*.

The system 200 includes a central processing unit (CPU) 201, an operation panel 203, and a memory 205. The CPU 201 is a processor, computer, microcontroller, or other circuitry that controls the operations of various components such as the operation panel 203, and the memory 205. The CPU 201 may execute software, firmware, and/or other instructions, for example, that are stored on a volatile or non-volatile memory, such as the memory 205, or otherwise provided to the CPU 201. The CPU 201 may be connected to the operation panel 203, and the memory 205, through wired or wireless connections, such as one or more system buses, cables, or other interfaces. In an embodiment of the present disclosure, the CPU 201 may include a custom Graphic processing unit (GPU) server software to provide real-time object detection and prediction, for all cameras on a local network.

The operation panel 203 may be a user interface and may take the form of a physical keypad or touchscreen. The operation panel 203 may receive inputs from one or more users relating to selected functions, preferences, and/or authentication, and may provide and/or receive inputs visually and/or audibly.

The memory 205, in addition to storing instructions and/or data for use by the CPU 201, may also include user information associated with one or more users. For example, the user information may include authentication information (e.g. username/pas sword pairs), user preferences, and other user-specific information. The CPU 201 may access this data to assist in providing control functions (e.g. transmitting and/or receiving one or more control signals) related to operation of the operation panel 203, and the memory 205.

In an embodiment of the present disclosure, the CPU 201 includes a raw risk information collection unit 202 for receiving information captured by the video sensors 104*a* and 104*b* and storing the information in the storage unit 210, and a processing and aggregating unit 204 configured to process and aggregate video streams to detect the activation by a warehouse operator of one or more trigger conditions associated with one or more risk instances. On detection of the activation of the trigger condition, the processing and aggregating unit 204 is configured to identify and document the attributes of each risk instance.

In the context of the present disclosure, risks may be broadly grouped into two classes, namely predefined risks and heuristic risks. The predefined risks are well-known risks, that may be pre-defined by a management team of the warehouse environment. By contrast, heuristic risks are to be discovered and learned by observation of the warehouse environment. Predefined risks may include risks arising from heavy packages, as heavy packages may cause injuries when they are manipulated by operators. Another example of a predefined risk includes risks arising from fragile packages, as incorrect handling of fragile packages may cause stock and financial loss. While a predefined risk may be established by the management team, the location of occurrences of the said predefined risk may vary with time owing to the dynamic nature of the warehouse environment. For example, the location of heavy and awkwardly-shaped packages on storage racks may change over time.

Localization of a given risk instance may be expressed with different granularities. In particular, whereas a coarse risk localization may rely on identifiers of the racks in the warehouse environment, a fine-grained risk localization may provide more precise location information.

In an embodiment of the present disclosure, the risk level includes two components, namely, recent risk level $P_{recent}$ and global risk level $P_{global}$. $P_{recent}$ expresses the number of risk incidents that recently occurred in a risk zone as a fraction of the total number of operations undertaken in the risk zone. $P_{global}$ expresses the total number of occurrences of risk incidents in the risk zone since the establishment of the warehouse, as a fraction of the total number of operations undertaken during that time period in that risk zone. $P_{recent}$ and $P_{global}$ respectively contribute 75% and 25% to the overall risk level computation.

More specifically, $$L_{magnitude},\ \text{magnitude} \in [1, 10],$$

$$\text{magnitude} = \text{round}\big(10 \cdot (3 \cdot P_{recent} + P_{global})/4\big),$$

$$P_{recent} = \text{count}(\text{incidents}_t,\ t \in \Delta T)/\text{count}(\text{operations}_t),\ t \in \Delta T,$$

$$P_{global} = \text{count}(\text{incidents}_t)/\text{count}(\text{operations}_t),\ t \in [-\infty\ \ldots\ \text{now}],$$

where:

- round function represents rounding to the nearest integer
- count function represents the counting of the number of instances of a considered parameter,
- $\text{incident}_t$ denotes a risk incident that happened at the time t in a given risk zone
- $\text{operation}_t$ represents the number of operations (e.g. job-filling, pallet unloading or rack-space packing etc.) undertaken by warehouse operators or other personnel at the time t in the considered risk zone
- $\Delta T$ is the time interval over which the occurrence of the relevant risk incident is calculated (e.g. $\Delta T$=14 days calculated from now, is used to calculate the number of risk incidents that occurred during the last 14 days).

Figure 2B:
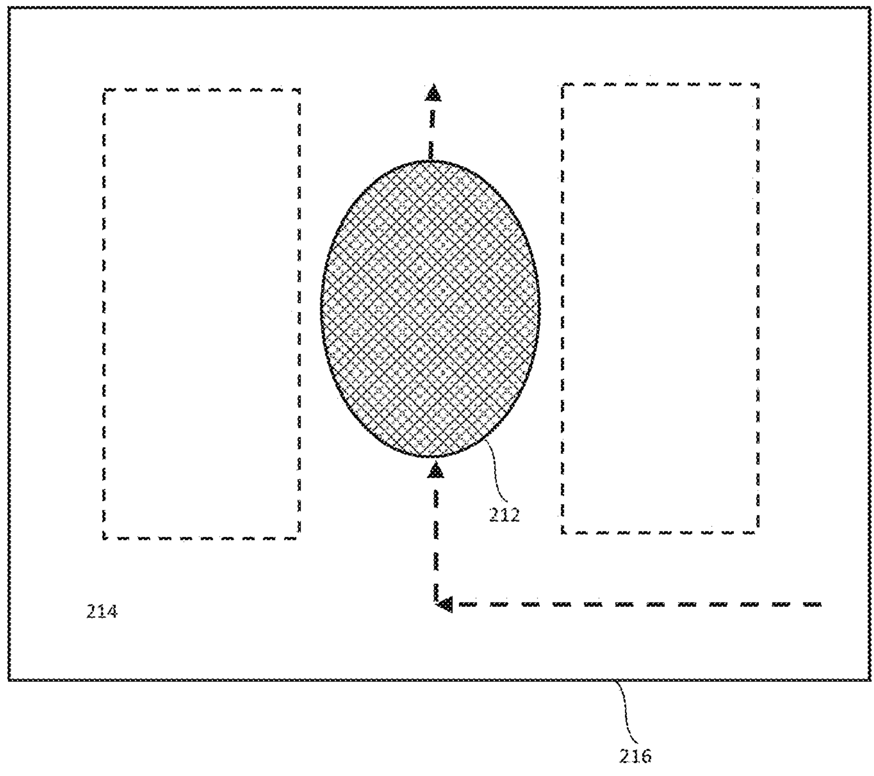
FIG. 2B illustrates a Warehouse Risk Map, in accordance with an embodiment of the present disclosure.

The central processing unit 201 further includes a risk map generation unit 206 for generating a Warehouse Risk Map 210 (as shown in FIG. 2B) based on the identified risk instances. The Warehouse Risk Map 210 is generated by superimposing an identified risk zone 212 on a two-dimensional map 214 of an observed warehouse environment (showing all racks and operational spaces therein). The Warehouse Risk Map 210 may also show an Operator Route 216 taken by an operator while moving about the warehouse environment.

The Warehouse Risk Map 210 is used to optimize the spatial deployment of video cameras in the warehouse environment so that their collective Field of View cover all the locations associated with each risk instance.

The central processing unit 201 includes a risk map updating unit 208 for updating the Warehouse Risk Map 210 according to a set of one or more of a set of pre-defined triggers (i.e. when there is a change in at least one of the risk types, risk levels, or risk zones) each of which is stored in the storage unit 210 and specifically linked with a given risk type. For example, when heavy packages are moved to another rack, the location of the risk associated with each heavy package changes to the new rack. Similarly, if the heavy packages are replaced with fragile ones, the type of risk changes for that risk instance. This allows fine customization of the moment when an update is necessary for the Warehouse Risk Map 210. For efficiency, not every risk incident occurrence causes an update to the Warehouse Risk Map 210. Additionally, the system settings for risk types and corresponding triggers may be periodically re-configured by the warehouse managers.

In an embodiment of the present disclosure, the risk map updating unit 208 is configured to automatically detect the occurrence of one or more risk incidents, and mark their location on the Warehouse Risk Map 210 to thereby illustrate the risk instances. However, since the location associated with a risk instance may vary with time, the Warehouse Risk Map 210 may be dynamically updated based on a risk-specific trigger to reflect these variations.

In the example of risk incidents arising from heavy packages, the location of such risk incidents may be ascertained from an inventory list of the warehouse environment 100. Thus, a rule for updating the trigger for the corresponding risk instances could be "Update the Warehouse Risk Map 210 every time the inventory list changes". Similarly, for risk incidents arising from fragile packages, the location of such risk incidents may be ascertained through the detection of damaged packages during order-picking. For example, the occurrence of such risk incidents may be detected by a Package Integrity Check AI (PICAI) component (not shown) of the processing and aggregating unit 204. Thus, a rule for updating the trigger for this risk instance could be "Update the Warehouse Risk Map 210 every time the PICAI detects a damaged package".

The PICAI determines package integrity status by processing video data captured by the video sensors 104*a* and 104*b*. More specifically, the PICAI comprises a trained deep neural network classifier (not shown) adapted to process a video stream from a video camera positioned to monitor the warehouse environment where packages are manipulated. The PICAI classifier may implement an architecture such as a visual geometry group (VGG) or a residual neural network (Resnet), and may be trained with a set of images labelled into two classes, namely damaged and non-damaged packages.

Figure 3A:
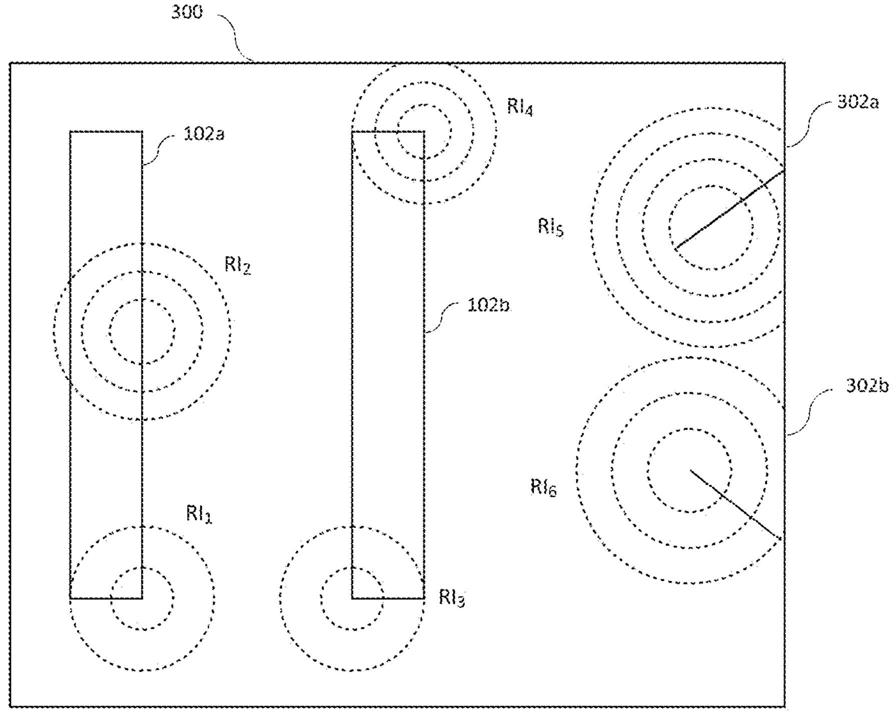
FIG. 3A illustrates an example of a contour plot visualization of the Warehouse Risk Map, in accordance with an embodiment of the present disclosure.

FIG. 3A illustrates an example of a contour plot visualization 300 of the Warehouse Risk Map in a warehouse environment comprising two racks 102*a* and 102*b* and two doors 302*a* and 302*b*, in accordance with an embodiment of the present disclosure. The contour plot visualization 300 is a visual output interface for warehouse managers that provides a perspective view on the cumulative occurrence of individual risk types at given locations in the warehouse environment. In the present example, the contour plot visualization 300 shows the presence of six risk incident hotspots ($RI_1$ to $RI_6$) in the warehouse environment. In this way, the contour plot visualization 300 supports the targeting of monitoring resources on areas of the warehouse environment where higher numbers of risk incidents have been observed.

Figure 3B:
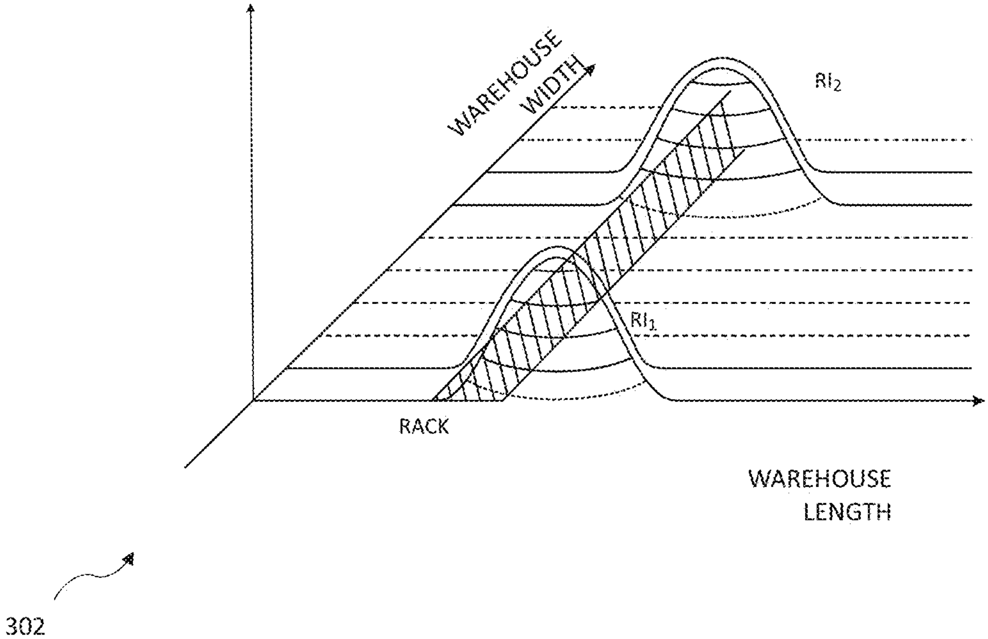
FIG. 3B illustrates an output visualization of the Warehouse Risk Map in the form of a 3D plot in accordance with an embodiment of the present disclosure.

FIG. 3B illustrates the output visualization of the Warehouse Risk Map in the form of a 3D plot 302 that shows an overall risk landscape in the warehouse environment through the elevation axis, in accordance with an embodiment of the present disclosure. The 3D plot 302 is an example of a 3D visualization of the Warehouse Risk Map for the first rack 102*b* in the warehouse environment of FIG. 3A, showing two risk incident ($RI_3$ to $RI_4$) hotspots connected with the first rack 102*b*.

Figure 4A:
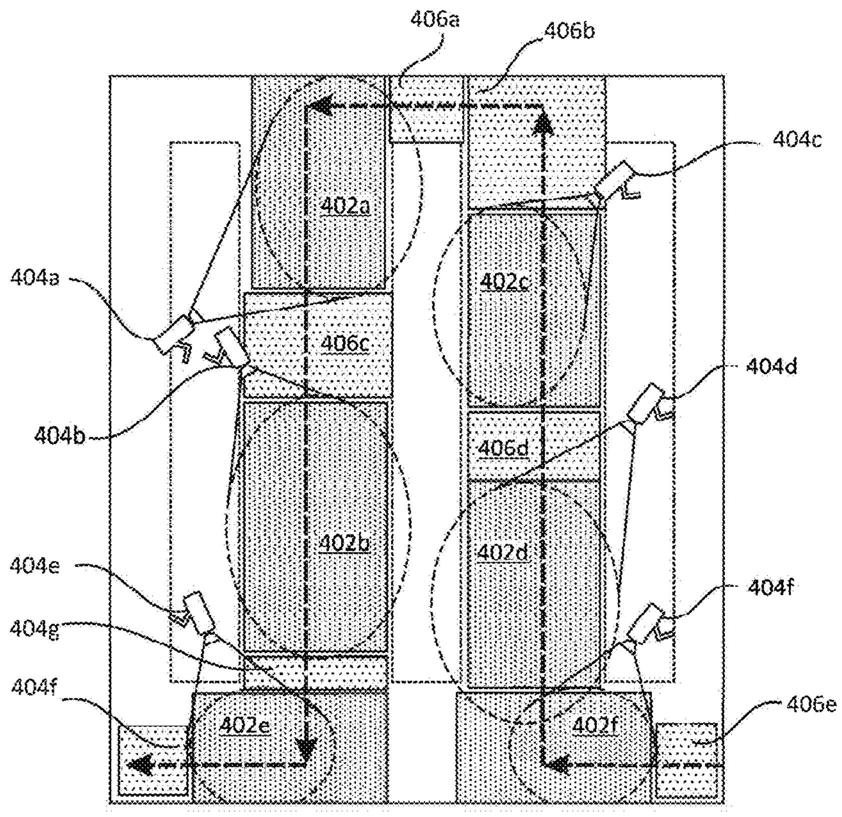
FIG. 4A illustrates a second warehouse environment in accordance with an embodiment of the present disclosure.

FIG. 4A illustrates a second warehouse environment 400 in accordance with an embodiment of the present disclosure. It would be apparent to one of ordinary skill in the art, that the first and second warehouse environment 100 and 400 may be the same.

The second warehouse environment 400 includes first through sixth Monitored Zones ($MZ_i$) 402*a* till 402*f* (hereinafter collectively referred to as Monitored Zones 402) monitored by corresponding video sensors 404*a* till 404*f* with respective Fields of View. A Monitored Zone is substantially rectangular in shape, and its area is limited by the Field of View of the corresponding monitoring video sensor (i.e. video camera).

The second warehouse environment 400 includes first through seventh Uncovered Zones ($UZ_j$) 406*a* till 406*g* (hereinafter collectively referred to as Uncovered Zones 406) which the video sensors 404*a* till 404*f* are unable to monitor. An Uncovered Zone ($UZ_j$) $j \in [1 \ldots M]$, where M is equal to the total number of such Uncovered Zones, may be an aperture (if any) between two consecutive Monitored Zones, or an aperture between a Monitored Zone and a proximal wall of the warehouse. Each successive Uncovered Zone is conferred with a unique identifier, for example, an index j incrementing from 1 according to the requirements of the warehouse management.

Figure 4B:
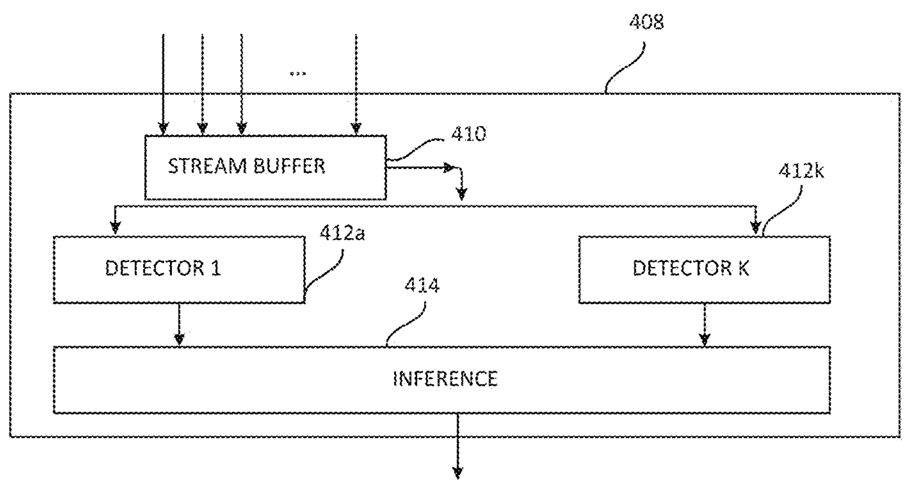
FIG. 4B illustrates a New Emerging Risk Discovery (NERD) component for discovering heuristic risks in the second warehouse environment.

FIG. 4B illustrates a New Emerging Risk Discovery (NERD) component 408 for discovering heuristic risks in the second warehouse environment 400, in accordance with an embodiment of the present disclosure.

The NERD component 408 is communicatively coupled to the set of video sensors (404*a* till 404*f* in FIG. 4A) either through a wired or a wireless communication network. Based on the input from the video sensors, the NERD component 408 is configured to determine the time spent by an operator traversing a Monitored Zone ($MZ_i$), time spent by an operator traversing an Uncovered Zone ($UZ_j$), object handling actions (pick/drop) in a Monitored Zone ($MZ_i$) and/or an Uncovered Zone ($UZ_j$), multiple handling actions of a same object within a Monitored Zone ($MZ_i$) and/or an Uncovered Zone ($UZ_j$); the operator movement pattern (e.g. list of trajectory segments) in a Monitored Zone ($MZ_i$) and/or an Uncovered Zone ($UZ_j$).

In an embodiment of the present disclosure, the NERD component 408 includes a stream buffer 410 for receiving and buffering video streams from the video sensors (404*a* till 404*f* in FIG. 4A), a set of first through $k^{th}$ detectors 412*a* till 412*k*, and an inference unit 414. Although, the NERD component 408 is shown to be an independent component communicatively coupled to the set of video sensors (404*a* till 404*f* in FIG. 4A), it would be apparent to one of ordinary skill in the art, that the NERD component 408 may be a part of the central processing unit (201 in FIG. 2A).

In an embodiment of the present disclosure, the first through $k^{th}$ detectors 412*a* till 412*k* are configured to process the video streams from video sensors (404*a* till 404*f* in FIG. 4A). The first through $k^{th}$ detectors 412*a* till 412*k* may include one or more detectors that implement human detection and tracking algorithms to determine the time spent by an operator in each location of the warehouse along an Operator Route (420 in FIG. 4A); to parse manager's reports; and to determine the number of risk incidents occurring at a given location in the warehouse.

The inference unit 414 is configured to learn "normal" operational parameters expressed as time spent by an operator in a given zone of the warehouse, and to identify abnormalities suggestive of the occurrence of a new risk type, for example, excessive time spent by an operator in the said zone.

Referring to FIG. 4B together with FIG. 4A, in an embodiment of the present disclosure, the NERD component 408 is configured to combine the results from individual Monitored Zones 402 to thereby monitor a significant proportion of the warehouse environment 400. In an embodiment of the present disclosure, an operator's movements about the warehouse may be effectively tracked by combining successive monitored zones 402 along the Operator Route 420. Thus, an Operator Route 420 taken by an operator may be described by a series of N successive Monitored Zones ($MZ_i$) $i \in [1 \ldots N]$, wherein the index i is set to a value of 1 at the start of the route and is incremented by one for each Monitored Zone ($MZ_i$) entered by the operator while progressing along the Operator Route 420. As the Operator Route 420 is covered by the Fields of View of consecutive video sensors (404*a* till 404*f*), the location of the operator can be tracked through the identity of the video sensor whose Field of View captures the operator. For example, an operator following the Operator Route 420 may traverse the Field of Views of the video sensors 404*f*, 404*d*, 404*c*, 404*a*, 404*b*, and 404*e*. Therefore, corresponding Monitored Zones 402*a*-402*f* may be linked in a given risk instance, i.e. risk location parameter corresponding to the identity/label of the video sensor that captured an operator involved in a risk incident, to thereby link the risk incident with the relevant Monitored Zone 402*a*-402*f*.

Figure 4C:
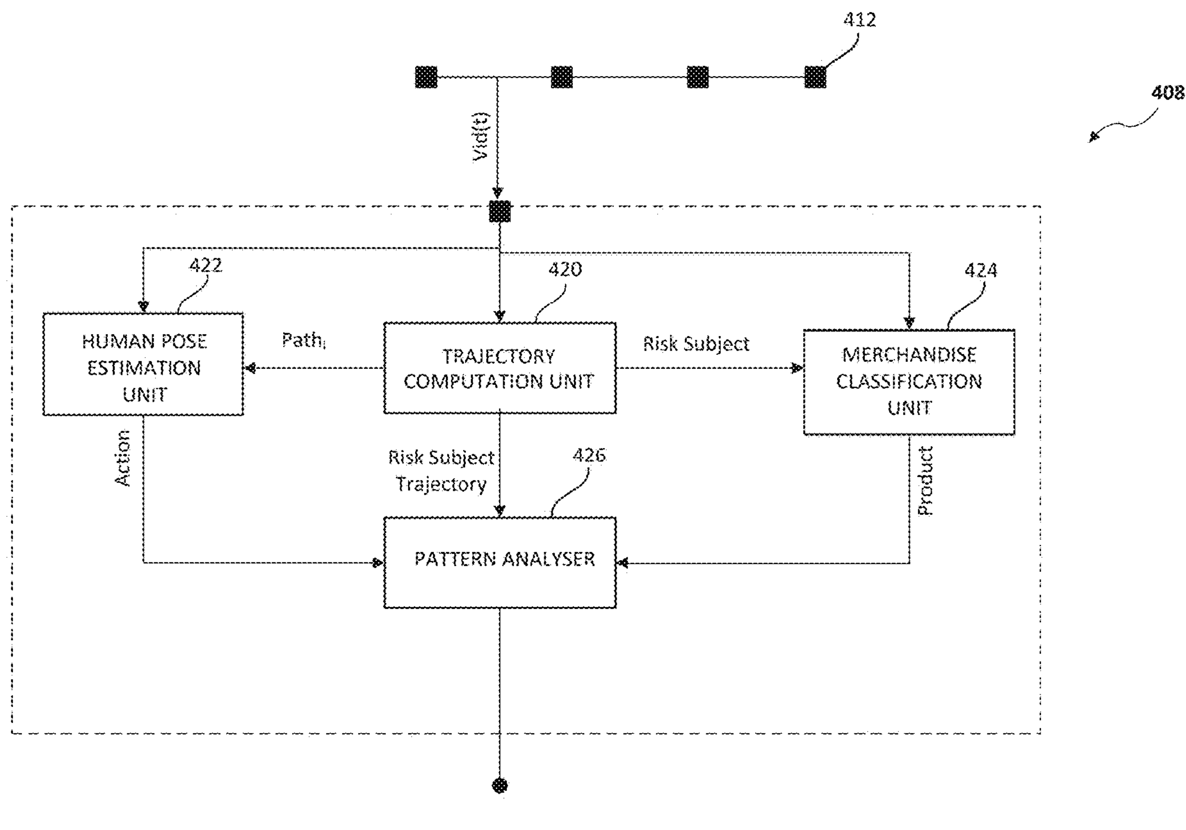
FIG. 4C is a block diagram illustrating the functional elements of the NERD component of FIG. 4B.

FIG. 4C is a block diagram illustrating the functional elements of the NERD component of FIG. 4B, as an embodiment of the present disclosure.

In an embodiment, the NERD component 408 comprises a Trajectory Computation Unit 420, a Human pose estimation unit 422, a Merchandise Classification Unit 424, and a Pattern analysis unit 426. The trajectory computation unit 420 is communicably coupled with the Human Pose Estimation Unit 422 and the Merchandise Classification Unit 424, and each of which is communicably coupled in turn with a Pattern Analysis Unit 426. Each of these will be described in more detail below.

Figure 4D:
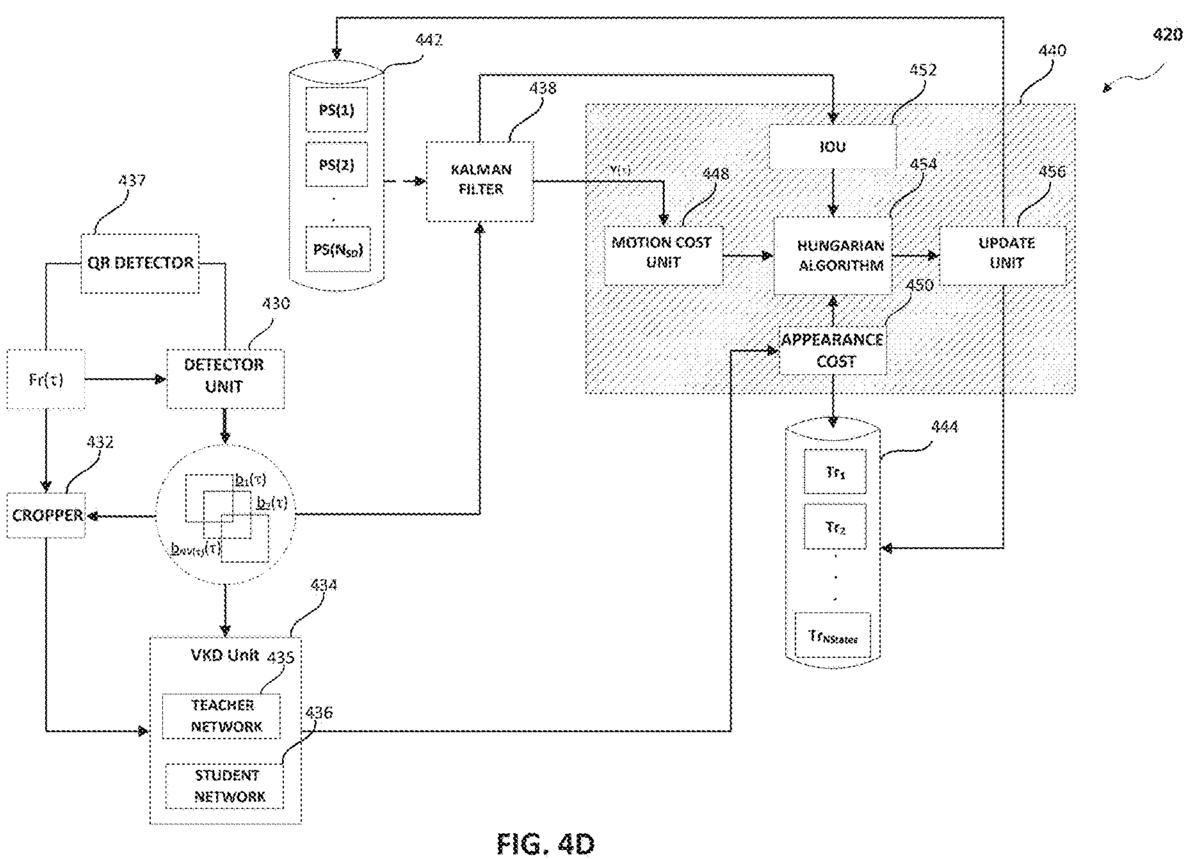
FIG. 4D is a block diagram illustrating the functional elements of a Trajectory Computation Unit of the NERD component of FIG. 4C.

FIG. 4D is a block diagram illustrating the functional elements of a Trajectory Computation Unit of the NERD component of FIG. 4C In an embodiment, the Trajectory Computation Unit 420 comprises a Detector Unit 430, a Cropper Unit 432, a video Knowledge Distillation Unit 434 (hereinafter referred to as VKD unit 434), a QR Detector 437, a Kalman Filter Unit 438, a Matcher Unit 440, a Previous State Database 442 and a Tracking Database 444.

In an embodiment, the Detector Unit 430 is communicatively coupled with one or more video sensors (for example, the first and second video sensors 104*a* and 104*b*) (not shown) installed at one or more locations in the warehouse. The video footage obtained from the video sensor (not shown) comprises a plurality of successively captured video frames, wherein p is the number of video frames in the captured video footage. A given video frame $Fr(\tau+i\Delta t) \in \mathbb{R}^{n \times m}$ is captured by a video camera at time instant (also known as sampling time) $\tau+i\Delta t$ wherein r is the time at which capture of the video footage starts and $\Delta t$ is the time interval (also known as the sampling interval) between the capture of a first video frame and the capture of the next video frame. Using this notation, the video footage captured by a video camera can be described as $VID \in \mathbb{R}^{n \times (p \times m)} = [Fr(\tau), Fr(\tau+\Delta t), Fr(\tau+2\Delta t) \ldots Fr(\tau+p\Delta t)]$.

Similarly, in the event video footage is captured from a plurality of video sensors, individual video frames captured by $q>1$ video sensors at a given sampling time ($\tau+i\Delta t$) can be concatenated, so that the video footage captured by the collective body of video sensors can be described as:

$$VID \in \mathbb{R}^{(pxm)x(nxq)} = \big[[Fr_0(\tau), Fr_1(\tau) \ldots Fr_q(\tau)]^T, [Fr_0(\tau+\Delta t), Fr_1(\tau+\Delta t) \ldots Fr_q(\tau+\Delta t)]^T, \ldots, [Fr_0(\tau+p\Delta t), Fr_1(\tau+p\Delta t) \ldots Fr_q(\tau+p\Delta t)]^T\big] \quad (1)$$

For brevity, a video frame formed by concatenating a plurality of video frames each of which was captured at the same sampling time (for example, $[Fr_0(\tau), Fr_1(\tau) \ldots Fr_g(\tau)]^T$) will be referred to henceforth as a "Concatenated Video Frame". Similarly, individual video frames concatenated within a Concatenated Video Frame will be referred to henceforth as "Concatenate Members". For clarity, in the following discussions, a current sampling time $t_k$ is given by $t_k=\tau+N\Delta t$, where $N<n$. A previous sampling time $t_p$ is a sampling time that precedes the current sampling time $t_k$ and is given by $t_p=\tau+D\Delta t$ where $0<D<N$. A current video frame $Fr(t_k)$ is a video frame captured at a current sampling time $t_k$. A previous video frame $Fr(t_p)$ is a video frame captured at a previous sampling time $t_p$.

In an embodiment, the Detector Unit 430 comprises an object detector algorithm adapted to receive a video frame or a Concatenated Video Frame and to detect therein the presence of a person, pallet and package. For brevity, persons, pallets and packages visible in a video frame will be referred to henceforth as "Risk Subjects".

For further clarity, a currently detected Risk Subject is a Risk Subject that has been detected by the Detector Unit 430 in a current video frame $Fr(t_k)$. A previously detected Risk Subject is a Risk Subject that has been detected in a previous video frame $Fr(t_p)$. A previous detection of a Risk Subject is the detection of the Risk Subject by the Detector Unit 430 in a previous video frame $Fr(t_p)$. A current detection of a Risk Subject is the detection of the Risk Subject by the Detector Unit 430 in the current video frame $Fr(t_k)$. Further, a most recent previous detection of a Risk Subject is a one of a one or more previous detections of a given Risk Subject by the Detector Unit 430 at a previous sampling time that is closest to the current sampling time, or in other words, at a given current time $t_k$, a most recent previous detection of a Risk Subject is the last previous detection of the Risk Subject in the previous video frames.

In an embodiment, the object detector algorithm is further configured to classify a detected Risk Subject as either a person, pallet or package, and to determine the location(s) of the Risk Subject(s); and to determine the location of the detected Risk Subject in the video frame or Concatenated Video Frame. The location of a detected Risk Subject is represented by the co-ordinates of a bounding box which is configured to enclose the Risk Subject. The co-ordinates of a bounding box are established with respect to the co-ordinate system of the video frame or Concatenated Video Frame. In particular, the object detector algorithm is adapted to receive individual successively captured video frames $Fr(i+i\Delta t)$ from the video footage VID; and to process each video frame $Fr(i)$ to produce one or more details of a set of bounding boxes $B(\tau)=[\underline{b}_1(\tau), \underline{b}_2(\tau) \ldots \underline{b}_i(\tau))]^T$ $i \le N_{RS}(\tau)$, where $N_{RS}(\tau)$ is the number of Risk Subjects detected and identified in the video frame $Fr(\tau)$ and $\underline{b}_i(\tau)$ is the bounding box encompassing an $i^{th}$ Risk Subject. The details of each bounding box $\underline{b}_i(\tau)$ comprise four variables, namely [x,y], h and w, where [x,y] is the co-ordinates of the upper left corner of the bounding box relative to the upper left corner of the video frame (whose coordinates are [0,0]); and h,w are the height and width of the bounding box respectively.

Thus, the output from the Detector Unit 430 is one or more Detection Measurement vectors each of which comprises the co-ordinates of a bounding box enclosing a Risk Subject detected in the received video frame, together with a classification label for each such detected Risk Subject. For brevity, the co-ordinates of a bounding box enclosing a Risk Subject detected in the received video frame will be referred to henceforth as a Detection Measurement vector. The Detector Unit 430 is communicatively coupled with the Kalman Filter Unit 438 and the Cropper Unit 432 to transmit thereto the Detection Measurement vector(s) calculated from the received video frame ($Fr(\tau)$).

To this end, the object detector algorithm comprises a deep neural network whose architecture is substantially based on the EfficientDet (as described in M. Tan, R. Pang and Q. V. Le, EfficientDet: Scalable and Efficient Object Detection, 2020 *IEEE/CVF Conference on Computer Vision and Pattern Recognition* (*CVPR*), Seattle, WA, USA, 2020, pp. 10778-10787). The architecture of the deep neural network of the object detector algorithm may also be based on YOLOv4 (as described in A Bochkovskiy, C-Y Wang and H-Y M Liao, 2020 arXiv: 2004.10934). However, the person skilled in the art will acknowledge that the above-mentioned neural network and architecture are provided for illustrative purposes only. In particular, the skilled person will understand that the preferred embodiment is not limited to these deep neural network architectures. On the contrary, the preferred embodiment is operable with any object detector architecture and/or training algorithm which is suitable for the detection and localization of people and objects such as pallets and packages in video footage. For example, the object detector algorithm could comprise a YOLOv5 architecture with an S or L architecture, or any other single-shot detector such as SSD, RetinaNet etc.

The goal of training the object detector is to cause it to establish an internal representation of a Risk Subject, wherein the internal representation allows the object detector to recognize a Risk Subject in subsequently received video footage. To meet this aim, the dataset used to train the object detector consists of video footage of a variety of scenarios recorded in a variety of different warehouses. The video footage, which will henceforth be referred to as the Training Dataset is assembled with the aim of providing robust, class-balanced information about Risk Subjects derived from different views of a Risk Subject obtained from different viewing angles. The members of the Training Dataset are selected to create sufficient diversity to overcome the challenges to subsequent Risk Subjects recognition posed by variations in illumination conditions, perspective changes, a cluttered background and most importantly intra-class variation. In most instances, images of a given scenario are acquired from multiple cameras, thereby providing multiple viewpoints of the scenario.

Prior to their use in the Training Dataset, the video footage is processed to remove video frames/images that are very similar. Similarly, some members of the Training Dataset are also used to train the VKD Unit 434. The members of the Training Dataset may also be subjected to further data augmentation techniques to increase the diversity thereof and thereby increase the robustness of the eventual trained object detector model. Specifically, the images/video frames are resized to a standard size wherein the size is selected to balance the advantages of more precise details in the video frame/image against the cost of more computationally expensive network architectures required to process the video frame/image. Similarly, all of the images/video frames are re-scaled to a value in the interval [−1, 1], so that no features of an image/video frame have significantly larger values than the other features.

In a further pre-processing step, individual images/video frames in the video footage of the Training Dataset are provided with one more bounding boxes, wherein each such bounding box is arranged to enclose a Risk Subjects visible in the image/video frame. The extent of occlusion of the view of a Risk Subjects in an image/video frame is assessed. Those Risk Subjects whose view in an image/video frame is more than 70% un-occluded are labelled with the class of the Risk Subjects (wherein the class label is selected from the set comprising person, pallet and package). Individual images/video frames are further provided with a unique identifier which is used, as will be described later, for the training of the VKD Unit 434.

In an embodiment, the Kalman Filter Unit 438 is also communicatively coupled with a Previous State Database 442. The Previous State Database 442 comprises a plurality of Previous State vectors $\underline{ps}_j$, $j \leq N_{PV}$, each of which is derived from the most recent observation of a Risk Subject detected in a previously captured video frame. Specifically, a Previous State vector $\underline{ps}_j$ of a $j^{th}$ Risk Subject is denoted by $\underline{ps}_j=[\phi; u, v, s, r, u', v', s', r']^T$ where:

- $\phi$ is the sampling instant at which the $j^{th}$ Risk Subject was last observed (where $\phi$ may be less than the most recent previous time stamp $\tau-\Delta t$, because a Risk Subject may have been occluded in the most recent previously captured video frames);
- $j \leq N_{PV}$ where $N_{PV}$ is the total number of Previous State vectors in the Previous State Database 442 (representing the total number of different Risk Subject previously observed over a pre-defined time interval);
- u and v respectively represent the horizontal and vertical location of the centre of the bounding box $\underline{b}_j(\phi)$ surrounding the $j^{th}$ Risk Subject detected at sampling instant $\phi$;
- s and r respectively represent the scale and aspect ratio of the bounding box $\underline{b}_j(\phi)$;
- u' and v' respectively represent the first derivative of the horizontal and vertical location of the centre of the bounding box $\underline{b}_j(\phi)$; and
- s' and r' respectively represent the first derivative of the scale and aspect ratio of the bounding box $\underline{b}_j(\phi)$.

In an embodiment, the Previous State Database 442 is initially populated with Previous State vectors derived by the Detector Unit 430 from the first video frame $Fr(\tau_0)$ received (at sampling time $\tau_0$), wherein $N_{RS}(\tau_0)$ is the total number of Risk Subjects observed in the first video frame and the first derivative terms (u', v', s' and r') of each of the initialised Previous State vectors are set to a value of zero.

In an embodiment, the Kalman Filter Unit 438 is adapted to receive a Detection Measurement vector from the Detector Unit 430, and configured to retrieve the Previous State vectors from the Previous State Database 442. The Kalman Filter Unit 438 is further adapted to estimate candidate dynamics of the Risk Subject enclosed by the bounding box whose details are contained in the Detection Measurement vector based on the estimated dynamics of previously detected Risk Subjects (represented by the Previous State vectors retrieved from the Previous State Database 442). For brevity, the estimated dynamics of a currently detected Risk Subject based on the Previous State vector (of a previously detected Risk Subject), will be referred to henceforth as the Predicted State vector of the currently detected Risk Subject. Thus, using this nomenclature, for a given detected Risk Subject in a current video frame, the Kalman Filter Unit 438 is adapted to calculate one or more candidate Predicted State vectors. The Kalman Filter Unit 438 is communicatively coupled with the Matcher Unit 440 to transmit thereto the candidate Predicted State vector(s) and the Actual Measurement vector of the currently detected Risk Subject.

In an embodiment, the Cropper Unit 432 is adapted to receive a video frame (Fr(τ)) and receive one or more Detection Measurement vectors from the Detector Unit 430. The Cropper Unit 432 is further adapted to crop the received video frame (Fr(τ)) to the region(s) enclosed by the bounding box(es) specified in the Detection Measurement vectors. For brevity, a cropped region that is enclosed by a bounding box, will be referred to henceforth as a Cropped Region. The Cropper Unit 432 is further adapted to transmit the Cropped Region(s) to the VKD Unit 434. While the Cropper Unit 432 is described herein as being a separate component to the Detector Unit 430, the skilled person will understand that the Cropper Unit 432 and the Detector Unit 430 could also be integral components.

In an embodiment, the VKD Unit 434 comprises a Views Knowledge Distillation (VKD) network (as described in Porrello A., Bergamini L. and Calderara S., Robust Re-identification by Multiple View Knowledge Distillation, Computer Vision, ECCV 2020, Springer International Publishing, *European Conference on Computer Vision*, Glasgow, August 2020). The VKD unit 434 further comprises a pre-trained Teacher Network 435 communicatively coupled with a Student Network 436. The Teacher Network 435 and the Student Network 436 have substantially matching architectures, namely a ResNet-101 convolutional neural network (as described in He K., Zhang X., Ren S. and Sun J. "Deep Residual Learning for Image Recognition", *IEEE Conference on Computer Vision and Pattern Recognition* (*CVPR*), Las Vegas, N V, 2016, pp. 770-778) with a bottleneck attention module (as described in Park, J., Woo, S., Lee, J., Kweon, I. S.: "BAM: bottleneck attention module" in British Machine Vision Conference (BMVC) 2018). The skilled person will understand that the above network architectures are provided for example only. In particular, the skilled person will understand that the preferred embodiment is in no way limited to the above-mentioned network architectures. Instead, the preferred embodiment is operable with any network architecture capable of forming an internal representation of a Risk Subject based on one or more of its physical appearance attributes, for example, the network employed in the VKD Unit 434 could be a ResNet-34, ResNet-50, DenseNet-121 or a MobileNet.

In an embodiment, prior to operation of the Trajectory Computation Unit 420, the Teacher Network 435 is trained on a selected plurality of video frames; and the Student Network 436 is trained from the Teacher Network 435 in a self-distillation mode as described below. In this way, the Teacher Network 435 and the Student Network 436 are trained to establish an internal representation of the appearance of a Risk Subject sufficient to permit subsequent identification of the Risk Subject should it appear in further captured video frames.

The Teacher Network 435 and the Student Network 436 are respectively trained using a first subset and a second subset of a gallery comprising a plurality of Concatenated Video Frames. Thus, the gallery comprises a plurality of scenes viewed from different viewpoints by a plurality of video sensors. In at least some of the scenes, one or more classes of Risk Subject are visible. These scenes mirror those used to establish the Training Dataset for the object detector algorithm of Detector Unit 430. Hence at least some of the members of the Training Dataset may be used as members of the gallery.

The first subset ($Tr\_SS_1$) comprises a first number (X) of Concatenated Video Frames from the gallery, as shown below:

$$Tr\_SS_1 \in \mathbb{R}^{(pxm)x(nxX)} = \big[[Fr_0(\tau), Fr_1(\tau) \ldots Fr_X(\tau)]^T, [Fr_0(\tau+\Delta t), Fr_1(\tau+\Delta t) \ldots Fr_X(\tau+\Delta t)]^T, \ldots, [Fr_0(\tau+p\Delta t), Fr_1(\tau+p\Delta t) \ldots Fr_X(\tau+p\Delta t)]^T\big]$$

The second subset ($Tr\_SS_2$) comprises a second number (Y) of Concatenated Video Frames from the gallery, wherein Y<X, as shown below.

$$Tr\_SS_2 \in \mathbb{R}^{(pxm)x(nxY)} = \big[[Fr_0(\tau), Fr_1(\tau) \ldots Fr_Y(\tau)]^T, [Fr_0(\tau+\Delta t), Fr_1(\tau+\Delta t) \ldots Fr_Y(\tau+\Delta t)]^T, \ldots, [Fr_0(\tau+p\Delta t), Fr_1(\tau+p\Delta t) \ldots Fr_Y(\tau+p\Delta t)]^T\big]$$

Thus, the first and second subset comprise the same images from the gallery. However, the first subset and the second subset differ according to the number of Concatenate Members in their respective Concatenated Video Frames, wherein the first subset comprises Concatenated Video Frames with a larger number of Concatenate Members than the Concatenated Video Frames of the second subset.

The gallery further comprises:

- details of one or more bounding boxes, wherein each bounding box is positioned to substantially surround a Risk Subject visible in at least one of the Concatenate Members of a Concatenated Video Frame in the gallery; and
- corresponding identifiers of the or each visible Risk Subject.

Accordingly, the first subset is accompanied with the details of the bounding box(es) enclosing each Risk Subject detected in a video frame of the first subset and identifiers of the Risk Subjects. Similarly, the second subset is accompanied with the details of the bounding box(es) enclosing each Risk Subject detected in a video frame of the second subset and identifiers of the Risk Subjects.

The goal of training the Teacher Network 435 is to establish an internal representation which enables it to subsequently recognize a Risk Subject visible in a Concatenated Video Frame based on the Risk Subject's physical appearance attributes. The Teacher Network 435 expresses its establishment of an internal representation of a Risk Subject's appearance by returning a ranked list of identifiers for the Risk Subject, the said ranked list comprising identifiers selected by the Teacher Network 435 from the first subset. The performance of the training process is assessed by computing how many times the correct identifier for a Risk Subject visible in a Concatenated Video Frame is among the first pre-defined number of identifiers returned by the Teacher Network 435 in response to that Concatenated Video Frame.

The goal of training the Student Network 436 is to use the content of the second subset together with aspects of the internal representation formed by the Teacher Network 435, to enable the Student Network 436 to form its own internal representation of a Risk Subject's physical appearance attributes; thereby allowing the Student Network 436 to subsequently recognize a Risk Subject visible in a video frame based on the Risk Subject's physical appearance attributes. To this end, the training procedure for the Student Network 436 employs a cost function comprising a weighted sum of a triplet loss term and a classification loss term, a knowledge distillation loss and an L2 distance term.

The goal of training the Student Network 436 is to use the content of the second subset together with aspects of the internal representation formed by the Teacher Network 435, to enable the Student Network 436 to form its own internal representation of a Risk Subject's physical appearance attributes; thereby allowing the Student Network 436 to subsequently recognize a Risk Subject visible in a video frame based on the Risk Subject's physical appearance attributes. To this end, the training procedure for the Student Network 436 employs a cost function comprising a weighted sum of a triplet loss term and a classification loss term, a knowledge distillation loss and an L2 distance term.

In an embodiment, I knowledge distillation loss is a cross entropy loss term expressing the difference between the identifier returned by the Teacher Network 435 in response to a Concatenated Video Frame and the identifier returned by the Student Network 436 in response to a Concatenated Video Frame comprising a subset of video frames from the Concatenated Video Frame given as input to the Teacher Network 435. Thus, the second cost function is formulated to cause the Student Network 436 to output a Detected Appearance vector that closely approximate the appearance vector outputted by the Teacher Network 435. Since the Teacher Network 435 is trained on Concatenated Video Frame comprising a larger number of Concatenate Members, the Teacher Network 435 will establish appearance vectors containing more information. The second cost function causes the additional information to be distilled into the Detected Appearance vectors outputted by the Student Network 436, even though the Student Network 436 does not receive as rich an input as the Teacher Network 435. The second cost function further comprises an L2 distance term expressing the distance between the internal representation formed in the Teacher Network 435 and that formed in the Student Network 436.

Prior to their use in the gallery, images are processed to remove those of similar appearance. The resulting images are further pre-processed by resizing, padding, random cropping, random horizontal flipping and normalization. Similarly, the images are subjected to a random erasing operation in which some of the pixels in the image are automatically erased. This is useful for simulating occlusion, so that the Tracking System becomes more robust to occlusion.

Once suitably trained and cross-validated, the Student Network 436 is configured to process a Cropped Region received from the Cropper Unit 432 to produce a set of Detected Appearance vectors $A(\tau)=[\underline{\alpha}_1(\tau), \underline{\alpha}_2(\tau) \ldots \underline{\alpha}_i(\tau))]^T$ $i \leq N_{RS}(i)$ relating to the Risk Subjects appearing in the Cropped Region. A Detected Appearance vector $\underline{\alpha}_i(\tau)$, $i \leq N_{RS}(\tau)$ (wherein $\|\alpha_i(\tau)\|=1$) is formed from the activation states of the neurons in the Student Network 436. Thus, a Detected Appearance vector $\underline{\alpha}_1(\tau)$ comprises the appearance attributes of a given Risk Subject as internally represented by the Student Network 436. The Student Network 436 is further adapted to transmit the set of Detected Appearance vectors $A(\tau)$ to the Matcher Unit 440.

The Matcher Unit 440 is communicatively coupled with the Kalman Filter Unit 438; and is configured to receive therefrom a set of candidate Predicted State vector(s) and the Actual Measurement vector of a currently detected Risk Subject. The Matcher Unit 440 is further communicatively coupled with the VKD Unit 434; and is configured to receive therefrom a set of Detected Appearance vectors $A(\tau)=[\underline{\alpha}_1(\tau), \underline{\alpha}_2(\tau) \ldots \underline{\alpha}_i(\tau))]^T$ $i \leq N_{RS}(i)$ of each and every Risk Subject detected in a given video frame $Fr(\tau)$ respectively.

The Matcher Unit 440 is also communicatively coupled with the Tracking Database 444. The Tracking Database 444 comprises a Tracking matrix $TR \in \mathbb{R}^{N_{PV} \times (N_{att} \times 100)}$ which comprises a plurality of Tracklet vectors $\underline{Tr}_j(\tau) \in \mathbb{R}^{N_{att} \times 100}$, $j \leq N_{PV}$. Each Tracklet vector $\underline{Tr}^j(\tau)$ comprises 100 Previous Appearance vectors $\underline{PA}^k \in \mathbb{R}^{N_{att}}$, $k \leq 100$ corresponding with each of the most recent 100 previous observations of a same Risk Subject. Each such Previous Appearance vector $\underline{PA}^k$ in turn comprises $N_{att}$ Previous Appearance Attributes $\underline{P\alpha}_p$, $p \leq N_{att}$, wherein the Previous Appearance Attributes comprise appearance attributes derived from an observation of a Risk Subject. Ideally, a Tracklet vector $\underline{Tr}_j(\tau)$ of a given Risk Subject at sampling instant $\tau$ is described by $\underline{Tr}_j(\tau)=[\underline{PA}_j(\tau-\Delta t), \underline{PA}_j(\tau-2\Delta t), \ldots \underline{PA}_j(\tau-100\Delta t)]$. However, other configurations for a Tracklet vector $\underline{Tr}_j(\tau)$ are also possible as described below:

- a Risk Subject may have been detected less than 100 sampling instants ago (i.e. at time $\tau-q\Delta t$ where $q<100$), in which case, the Previous Appearance Attributes $\underline{P\alpha}_p$ from before the Risk Subject was first detected will 24 initialized to a value of zero;
- the view of a Risk Subject may have been obscured during one or more of the previous sampling instants, meaning that the Tracklet vector $\underline{Tr}_j(\tau)$ of the Risk Subject may not include Previous Appearance vectors $\underline{PA}^k$ from consecutive sampling instants;
- at a given sampling instant, a different Risk Subject with similar appearance may have been mistaken to be the Risk Subject whose movement is denoted by the Tracklet vector $\underline{Tr}_j(\tau)$. This will be referred to henceforth as an identity switch. Identity switches typically occur when an object detector algorithm forms a poor internal representation of the physical appearance attributes of a studied Risk Subject.

To address the complexity posed by the timing of individual Previous Appearance vectors in different Tracklet vectors $\underline{Tr}_j(\tau)$, for simplicity a universal index k will be used henceforth to refer to individual Previous Appearance vectors $\underline{T\alpha}^k$ in a given Tracklet vector, (wherein $\underline{Tr}_j(\tau)=\{\underline{P\alpha}^k \in \mathbb{R}^{N_{att}}\}$, $k \leq 100$) and a corresponding record is maintained of the sampling instants of each such indexed Previous Appearance vector in a given Tracklet vector.

In an embodiment, the Tracking Database 444 is initially populated with Detected Appearance vectors $\underline{\alpha}_j(1)$ $j \leq N_{RS}(\tau_0)$ calculated by the Student Network 436 in response to the first video frame $F(\tau_0)$ received (at sampling time $\tau_0$). Thus, the Tracking Database 444 is an appearance-based counterpart for the dynamics/state-based Previous State Database 442. Indeed, since the Tracking Database 444 and the Previous State Database 442 are both populated according to the order in which Risk Subjects are detected in a monitored area, the ordering of the Tracklet vectors $\underline{Tr}_j(\phi)$, $j \leq N_{PV}$ in the Tracking Database 444 matches that of the Previous State vectors $\underline{ps}_j(\phi)$, $j \leq N_{PV}$ in the Previous State Database 442.

In an embodiment, the Matcher Unit 440 comprises a Motion Cost Unit 448, an Appearance Cost Unit 450 and, an Intersection over Union (IoU) Unit 452, all of which are communicatively coupled with a Hungarian Algorithm Unit 454. The Hungarian Algorithm Unit 454 is further communicatively coupled with an Update Unit 456, wherein the Update Unit 456 is itself communicatively coupled with the Previous State Database 442 and the Tracking Database 444.

In an embodiment, the Motion Cost Unit 448 is adapted to calculate the squared Mahalanobis distance $\Delta_M$ matrix representing the squared distance $$(\delta_{i,j}^{M})$$

between a given Actual Measurement vector $\underline{z}_i(\tau)$ and a Predicted Measurement vector $(\underline{\hat{m}}_j(\tau))$ calculated from each Predicted State vector (i.e. $\underline{\hat{m}}_j(\tau)=H_\tau\underline{\hat{x}}_j(\tau)_{|\tau}$) at a given sampling instant $\tau$.

$$\Delta_M = Y(\tau)^T S_M Y(\tau) \tag{2}$$

where $S_M$ is the covariance matrix of $Y(\tau)$

State estimation uncertainty is addressed by measuring how many standard deviations the Actual Measurement vector $\underline{z}_i(\tau)$ is from the Predicted Measurement vector $(\underline{\hat{m}}_j(\tau))$. Thus, an unlikely association of a given Actual Measurement vector $\underline{z}_i(\tau)$ with a given Previous State vector $\underline{ps}_j(\phi)$ can be excluded, by thresholding the Mahalanobis distance $\Delta_M$ at a 95% confidence interval calculated from the $\chi^2$ distribution. Specifically, by implementing this thresholding function ($Th^{(M)}$), a State Indicator matrix $SI \in \mathbb{R}^{N_{RS}(\tau)\times N_{PV}}$ is populated with binary values $SI_{i,j}$, where $$SI_{i,j} = 1 \text{ if } \delta_{i,j}^{M} \leq Th^{(M)}$$

(thereby denoting that the association of Actual Measurement vector $\underline{z}_i(\tau)$ with Previous State vector $\underline{ps}_j(\phi)$ is admissible for matching by the Hungarian algorithm in the Hungarian Algorithm Unit 454) and $SI_{i,j}=0$ otherwise.

In an embodiment, the Appearance Cost Unit 450 is configured to retrieve from the Tracking Database 444 each of a plurality of Tracklet vectors $\underline{Tr}_j(\tau)\in \mathbb{R}^{N_{att}\times 100}$, $j\leq N_{PV}$; and to calculate a minimum cosine distance $$(\delta_{i,j,k}^{A})$$

between the Detected Appearance vector of an $i^{th}$ Risk Subject detected at sampling instant r and the Previous Appearance Attributes of every Previous Appearance vector in a $j^{th}$ Tracklet vector $$\delta_{i,j,k}^{A} = \min\left(1 - \underline{\alpha}_i(\tau)^T \underline{PA}_j^k\right),\ k \leq 100 \tag{3}$$

In an analogous manner to the Motion Cost Unit 448, the Appearance Cost Unit 450 employs a threshold operation on the minimum cosine distance $$(\delta_{i,j,k}^{A})$$

to exclude an unlikely association of the Detected Appearance vector $(\underline{\alpha}_j(\tau))$ of a given Risk Subject with a given Previous Appearance vector $\underline{TA}^k$ in a given Tracklet vector $\underline{Tr}_j(\tau)$ in the Tracking Database 444. Specifically, by implementing this thresholding function ($Th^{(A)}$), an Appearance Indicator matrix $AI\in \mathbb{R}^{N_{RS}(\tau)\times N_{PV}}$ is populated with binary values $AI_{i,j}$, where $$AI_{i,j} = 1 \text{ if } \delta_{i,j}^{A} \leq Th^{(A)}$$

(thereby denoting that the association of Detected Appearance vector $(\underline{\alpha}_1(\tau))$ with Previous Appearance vector $\underline{PA}^k$ is admissible for matching by the Hungarian algorithm in the Hungarian Algorithm Unit 454) and $AI_{i,j}=0$ otherwise. The cosine distance metric is useful for re-identifying a Risk Subject after a long-term occlusion thereof that would otherwise make a motion-based metric less capable of discriminating between potential Risk Subject matches.

In an embodiment, the IoU Unit 452 is adapted to receive the Predicted Measurement vectors $(\underline{\hat{m}}_j(\tau), j\leq N_{PV})$ from the Kalman Filter Unit 438; and the bounding box vectors $(\underline{b}_j(\tau), j\leq N_{RS(\tau)})$ established by the Detector Unit 430 in response to a received video frame $Fr(\tau)$. The IoU Unit 452 is further adapted to calculate an intersection over union (IoU) measurement between each bounding box vector $\underline{b}_j(\tau)$ and each Predicted Measurement vector $\underline{\hat{m}}_j(\tau)$ and to employ a thresholding operation on the minimum IoU value, to exclude an unlikely association of a bounding box vector $\underline{b}_j(\tau)$ calculated from a received video frame $Fr(\tau)$ and a predicted bounding box based on predicted system dynamics.

In an embodiment, the Hungarian Algorithm Unit 454 is adapted to receive the minimum cosine distance $$(\delta_{i,j,k}^{A})$$

from the Appearance Cost Unit 450; and squared Mahalanobis distance $$(\delta_{i,j}^{M})$$

from the Motion Cost Unit 448. The Hungarian Algorithm Unit 454 is adapted to calculate a weighted sum of the minimum cosine distance $$(\delta_{i,j,k}^{A})$$

and the squared Mahalanobis distance $$(\delta_{i,j}^{M}),$$

using a weighting variable $\lambda$ which is initially set to a pre-defined value and later tuned as appropriate for the relevant use case.

$$c_{i,j} = \lambda\delta_{i,j}^{M} + (1-\lambda)\delta_{i,j,k}^{A} \tag{4}$$

In an embodiment, the Hungarian Algorithm Unit 454 is further adapted to populate an Association matrix with values formed from the product of the corresponding binary variables of the State Indicator matrix $SI \in \mathbb{R}^{N_{RS}(\tau) \times N_{PV}}$ and the Appearance Indicator matrix $AI \in \mathbb{R}^{N_{RS}(\tau) \times N_{PV}}$. An association between a recent detection of an $i^{th}$ Risk Subject and the state/dynamics and appearance of a historically detected $i^{th}$ Risk Subject is admissible for matching by the Hungarian algorithm if the corresponding binary variable in the Association matrix is valued at 1. The Hungarian Algorithm is implemented to determine assignments between admissible Risk Subjects and state/dynamics on the basis of the weighted sum.

In the event a recently detected $i^{th}$ Risk Subject cannot be matched to a $j^{th}$ Tracklet vector $\underline{Tr}_j(\tau)$, any Tracklet vector $\underline{Tr}_j(\tau)$ that has not been matched with a Risk Subject over the previous pre-defined number of sample instants are selected, to form a set of historically unmatched Tracklet vectors $\underline{UTr}_j(\tau)$. The Hungarian Algorithm Unit 454 is then adapted to implement a further iteration thereof to determine assignments of unmatched recently detected $i^{th}$ Risk Subjects to each of the historically unmatched Tracklet vectors $\underline{UTr}_j(\tau)$.

In this process, the Hungarian Algorithm Unit 454 is adapted to sort the unmatched Tracklet vectors $\underline{UTr}_j(\tau)$ in ascending order according to their age. Specifically, the unmatched Tracklet vectors $\underline{UTr}_j(\tau)$ are ordered according to the elapsed time ($q\Delta t$) between a current sampling instant ($\tau$) and the sampling instant of the most recent Previous Appearance vector $\underline{P\alpha}^k$, $k \leq 100$ thereof. As will be recalled, the most recent Previous Appearance vector of a Tracklet vector represents the last (or most recent) time at which a Risk Subject corresponding with the Tracklet vector was observed. For brevity, the number of samples between the current sampling instant and the sampling instant of the most recent Previous Appearance vector $\underline{P\alpha}^k$ of an unmatched Tracklet vector $\underline{UTr}_j(\tau)$ will be referred to henceforth as the age of the unmatched Tracklet vector $\underline{UTr}_j(\tau)$. In other words, an unmatched Tracklet vector $\underline{UTr}_j(\tau)$ whose most recent Previous Appearance vector $\underline{P\alpha}^k$ is one sample prior to the current sampling instant will be referred to as an unmatched Tracklet vector $\underline{UTr}_j(\tau)$ of age one sample. Similarly, an unmatched Tracklet vector $\underline{UTr}_j(\tau)$ whose most recent Previous Appearance vector $\underline{P\alpha}^k$ is two samples prior to the current sampling instant will be referred to as having an age of two samples, and so forth.

In an embodiment, the Hungarian Algorithm is implemented to determine assignments of a recently detected $i^{th}$ Risk Subject to each $j^{th}$ unmatched Tracklet vector $\underline{UTr}_j(\tau)$ in order of increasing age of the unmatched Tracklet vector $\underline{UTr}_j(\tau)$. In particular, the Hungarian Algorithm Unit 454 is adapted to select each of the unmatched Tracklet vectors $\underline{UTr}_j(\tau)$ of age one sample and attempt to find an assignment of the recently detected $i^{th}$ Risk Subject therewith.

In an embodiment, if in the event a match is not identified between the recently detected $i^{th}$ Risk Subject and the unmatched Tracklet vectors $\underline{UTr}_j(\tau)$ of age one sample, the Hungarian Algorithm Unit 454 is adapted to select each of the unmatched Tracklet vectors $\underline{UTr}_j(\tau)$ whose age is two samples and attempt to find an assignment of the recently detected $i^{th}$ Risk Subject therewith. In the event a match is not identified, the Hungarian Algorithm Unit 454 is adapted to select in turn each of the unmatched Tracklet vectors $\underline{UTr}_j(\tau)$ whose age is three samples and attempt to find an assignment of the recently detected $i^{th}$ Risk Subject therewith. This process is repeated for a pre-determined number ($A_{max}$) number of ages of the unmatched Tracklet vectors $\underline{UTr}_j(\tau)$. The resulting distance between an unmatched Tracklet vector $\underline{UTr}_j(\tau)$) and the detected $i^{th}$ Risk Subject will be the smallest distance computed between the detected $i^{th}$ Risk Subject and each Previous Appearance vector in that Tracklet vector $\underline{UTr}_j(\tau)$).

A given iteration of this process will not override an existing matching, as an unmatched Tracklet vector $\underline{UTr}_j(\tau)$ under consideration during the iteration will have a different age to the unmatched Tracklet vectors $\underline{UTr}_j(\tau)$ considered during a previous iteration. Furthermore, any recently detected $i^{th}$ Risk Subjects that have been matched during a given iteration will be excluded from consideration during subsequent iteration. This approach is premised on the belief that unmatched Tracklet vectors $\underline{UTr}_j(\tau)$ of least age are likely to be more similar to a given recently detected $i^{th}$ Risk Subject than older unmatched Tracklet vectors $\underline{UTr}_j(\tau)$.

In an embodiment, the Hungarian Algorithm Unit 454 is further adapted to receive the intersection over union measurements from the IoU Unit 452 and to use the intersection over union measurements to determine assignments of unmatched recently detected $i^{th}$ Risk Subjects to each of the unmatched Tracklet vectors $\underline{UTr}_j(\tau)$ of age 1 sample.

In an embodiment, the Hungarian Algorithm Unit 454 is adapted to transmit to the Update Unit 456 a set of first matching indices and second matching indices, being the indices i and j of the matching recently detected Risk Subjects and Tracklet vectors.

In an embodiment, the Update Unit 456 is adapted to transmit to the Previous State Database 442, Actual Measurement vectors $\underline{z}_i(\tau)$ together with different instructions depending on whether the index of a given Actual Measurement vector $\underline{z}_i(\tau)$ matches a first matching index. Specifically, if an index of a given Actual Measurement vector $\underline{z}_i(\tau)$ matches a first matching index, the instructions transmitted by the Update Unit 456 comprise an instruction to activate the Kalman Filter Unit 438 to compute a new Predicted State Vector $\hat{\underline{x}}(\gamma)_{|\gamma-1}$ using the matching Previous State Vector. The new Predicted State Vector is projected in the Actual Measurement space and the difference between the projected prediction and Actual Measurement is computed having the goal in updating the Previous State vector. The instructions further provide that the Previous State vector $\underline{ps}_j(\phi)$ whose index matches the second matching index is to be updated with the given Actual Measurement vector $\underline{z}_i(\tau)$ (and the first derivative components (u', v', s' and r') of the Previous State vector $\underline{ps}_j(\phi)$ be updated with those of the new Predicted State vector $\hat{\underline{x}}(\gamma)_{|\gamma-1}$). By contrast, in the event an index of a given Actual Measurement vector $\underline{z}_i(\tau)$ does not match a first matching index, the instructions transmitted by the Update Unit 456 comprise an instruction to use the Actual Measurement vector $\underline{z}_i(\tau)$ to add a new Previous State vector $\underline{ps}_j(\phi)$ to the Previous State Database 442. Specifically, the new Previous State vector $\underline{ps}_j(\phi)$ is denoted by $\underline{ps}_j(\phi)=[\underline{z}_i(\tau), u', v', s', r']^T$ where the first derivative terms (u', v's' and r') are initialised to a value of zero.

In an embodiment, the Update Unit 456 is adapted to transmit to the Tracking Database 444, each of a set of Detected Appearance vector $A(\tau)=[\underline{\alpha}_1(\tau), \underline{\alpha}_2(\tau) \ldots \overline{\alpha}_i(\tau))]^T$ $i \leq N_{Obj}(\tau)$ of each Risk Subject detected in a given video frame $Fr(\tau)$, together with different instructions depending on whether the index of a given Detected Appearance vector $\underline{\alpha}_i(\tau)$ matches a first matching index. If an index of a given Detected Appearance vector $\overline{\alpha}_i(\tau)$ matches a first matching index, the instructions transmitted by the Update Unit 456 comprise an instruction to add the Detected Appearance vector $\alpha_i(\tau)$ to the Tracklet vector $\underline{Tr}_j(\tau)$ whose index matches the second matching index. Specifically, the instruction comprises an instruction to insert the Detected Appearance vector $\overline{\alpha}_i(\tau)$ as the first Previous Appearance vector $\underline{PA}^1$ and to delete the last Previous Appearance vector $\underline{PA}^{100}$ of the Tracklet vector $\underline{Tr}_j(\tau)$. By contrast, in the event an index of a given Detected Appearance vector $\overline{\alpha}_i(\tau)$ does not match a first matching index the instructions transmitted by the Update Unit 456 comprise an instruction to add a new Tracklet vector $\underline{Tr}_j(\tau)$ to the Tracking Database 444. Specifically, the first Previous Appearance vector $\underline{PA}^1$ of the new Tracklet vector $\underline{Tr}_j(\tau)$ comprises the Detected Appearance vector $\underline{\alpha}_i(\tau)$.

On receipt of the instructions, the Previous State Database 442 and the Tracking Database 444 are also adapted to review the age of its Previous State vectors $\underline{ps}_j(\tau)$ and corresponding Tracklet vectors $\underline{Tr}_j(\tau)$. The age of a Tracklet vector $\underline{Tr}_j(\tau)$ is denoted as the elapsed time (qΔt) between a current sampling instant (τ) and the sampling instant of the first Tracking Appearance vector Tot' of the Tracklet vector. In the event the age of a Tracklet vector $\underline{Tr}_j(\tau)$ exceeds a pre-defined number of sampling intervals, the Previous State Database 442 and the Tracking Database 444 are adapted to delete the Tracklet vector $\underline{Tr}_j(\tau)$ and corresponding previous State vectors $\underline{ps}_j(\tau)$. In this way, the Previous State Database 442 and the Tracking Database 444 are cleansed of records of Risk Subjects that have left the warehouse, to prevent the accumulation of unnecessary records therein and thereby control the storage demands of the preferred embodiment.

In an embodiment, the QR Detector 437 implements a QR detection algorithm. The purpose of the QR Detector 437 is to permit the identification of warehouse staff based on the presence of the Quick Response (QR) code on a tag worn on the person's uniform.

In one embodiment the QR Detector 437 is implemented using a neural network based on the Yolo_v5 architecture. The skilled person will acknowledge that this network architecture is provided for illustration purposes only. In particular, the skilled person will acknowledge that the preferred embodiment is not limited to the use of this network architecture. On the contrary, the preferred embodiment is operable with any network architecture which enables the detection and recognition of a QR present in an image. For example, the preferred embodiment is operable with any other single-shot detector such as RetinaNet.

During training, a Reference Frame is created, wherein the Reference Frame is video frame from video footage captured of the warehouse in the absence of a QR code. In a next step, a training dataset is created by cutting short videos from the raw video footage captured by the video sensors in the warehouse. The short videos contain sequences where a QR code is shown to a video camera. To ensure diversity of feature distribution, video frames are extracted from the short videos using an average hashing algorithm.

Once trained, the Yolo_v5 network is configured to receive a video frame Fr(τ); and in response thereto, to output three vectors, as follows:

- the coordinates of the centre of a bounding box encompassing a QR code detected in the received video frame, together with the width and height of the bounding box, wherein the width and height are normalized relative to the width and height respectively of the video frame;
- an objectness score which denotes the neural network's confidence (valued between 0 and 1), that an object center exists at a given location in the video frame; and
- the class probabilities of the detected objects.

On detecting a QR code in a video frame Fr(τ), the QR Detector 437 is configured to crop a corresponding region from the video frame Fr(τ). The cropped region corresponds with that occupied by the bounding box surrounding the QR code with 20 pixels added on each side of the bounding box, to ensure the whole QR code is contained in the cropped region. The QR code in the cropped region is then decoded using a barcode reading tool which may comprise any of Pyzbar, PyQRCode, qrcode and qrtools etc. The output from the barcode reading tool comprises a string of characters decoded from the QR code. The QR Detector 437 is configured to associate the string with the person detected, by the Detector Unit 430, at a position closest to the QR code in the video frame Fr(τ). Thus, the capability of the Trajectory Computation Unit 420 to re-identify a person from one video frame to another is enhanced through its coupling with an identity assigned to the person based on the QR code they present to the video sensors of the warehouse.

The Merchandise Classification Unit 424 is configured to analyse the content of a pallet or a package detected by the Detector Unit 430 in a received video frame Fr(τ). The Merchandise Classification Unit 424 comprises two communicatively coupled modules, namely an instance segmentation Unit and an image retrieval Unit. The instance segmentation Unit performs instance segmentation and the image retrieval Unit uses an image retrieval algorithm to classify cropped bounding boxes of products, that were detected by the instance segmentation Unit.

To address periodic changes in the appearance of products, the image retrieval Unit comprises a first model to detect the presence of a product and a second model to recognize the product using prior knowledge in the form of a product database that can be easily updated. The second model is trained with the classes "pack", "box" and "vegetables". However, the classes are extendable to include "small pack", "medium pack" and "large pack".

To this end, the Instance segmentation is employed because products may be stacked erratically on a pallet; and a pixel level mask will increase the accuracy of detecting the products. In a preferred embodiment, the instance segmentation Unit employs a transformer-based model (as described by Z Liu, Y, Lin, Y. Cao, H. Yu, Y. Wei, Z. Zhang, S. Lin, and B. Gao, Swin Transformer: Hierarchical Vision Transformer using Shifted Windows, *Proceedings of the IEEE/CVF International Conference on Computer Vision* (*ICCV*), 2021, pp. 10012-10022). However, the skilled person will acknowledge that this transformer model is provided for illustration purposes only. In particular, the skilled person will acknowledge that the preferred embodiment is not limited to the use of this transformer model. On the contrary, the preferred embodiment is operable with any transformer-based or CNN-based backbone that can be used for instance segmentation.

In an embodiment, the Image Retrieval Unit implements an algorithm for product re-identification using a neural network that learns an embedding representation for each instance of a product contained in a product image database. More specifically, the Image Retrieval Unit compares the visual appearance of a pallet in a received video frame Fr(i) with appearance information of products contained in the warehouse's stock inventory. The appearance information is expressed in images of the products, the said images being stored in the product database. From these images, information about the appearance of a product under a variety of conditions (e.g. different viewing perspectives and rotation angles) can be expressed as embedding vectors formed by an embedding model such as VKD or Siamese Nets. The skilled person will understand that these embedding models are provided for illustrative purposes only. In particular, the skilled person will understand that the preferred embodiment is not limited to these embedding networks. On the contrary, the preferred embodiment is operable with any encoder model, capable of forming embedding vector representations of the appearance of a product, for example classic convolutional neural network (CNN). Several images of each product are used to train the embedding model. The embedding model can also be trained on image(s) of an entire pallet rather than images of each product.

Using their embedding vectors, the Image Retrieval Unit compares a product detected in a received video frame Fr(i) with products in the product database by means of a simple distance metric in the embedding space. In one embodiment the distance metric is a cosine metric or a Euclidean distance metric. The output from the Image Retrieval Unit is a label identifying the product whose image is contained in the product image database and which matches the product detected in a received video frame by the Detector Unit 430 of the Trajectory Computation Unit 420. For brevity, this label will be referred to henceforth as a "product label".

Returning to FIG. 4C, In an embodiment, the Human Pose Estimation Unit 422 is configured to receive:

- video footage from the video sensors in the warehouse; and
- a Path data set from the Trajectory Computation Unit 420, wherein the Path data set details the times and locations in the warehouse at which an $i^{th}$ person was detected by the video sensors.

In an embodiment, the Human Pose Estimation Unit 422 is configured to recognize and extract a set of human actions from the received video footage. The actions most likely to be performed by staff in the warehouse comprise squatting, bending, and reaching movements. These actions are recognised through human pose estimation of each person tracked by the Trajectory Computation Unit 420. A human pose is formed by 16 important points of the human skeleton, namely, right/left ankle, right/left knee, right/left hip, pelvis, thorax, upper neck, head top, right/left wrist, right/left shoulder, right/left elbow. The Human Pose Estimation Unit 422 is configured to detect movements of individual body parts and combines successive detected movements to classify the action performed by the $i^{th}$ person. For example, to detect a squatting action, we analyse a person's head and shoulder joints for the presence of at least three repetitive movements in the vertical axis performed within a 3-minute time interval.

Using the co-ordinates of a person received from the Trajectory Computation Unit 420, the Human Pose Estimation Unit 422 is configured to apply single-person pose estimation to determine the pose of that person. To this end, the Human Pose Estimation Unit 422 is configured to use the UniPose neural network architecture that uses historical information to allow a temporal component to be considered and thereby better estimate joints in the presence of blurring or occlusion. The network is trained with frames labelled in the same way as the MPII Dataset but simplified to use 2D joints. The human pose estimated by the network is then post-processed using a time-based sliding window of an interval $t_p$ (e.g. $t_p$=5 s) to extract the action corresponding to the person's body movements in the interval. The movements are defined by the trajectory (over each $t_p$ interval) of the body joint positions identified by the network. One or more actions (e.g. picking, dropping, bending, reaching, or throwing) corresponding with the detected body joint trajectories is determined in accordance with pre-defined detection strategies (i.e. which link known body part movements to specific known activities).

In an embodiment, the output from the Human Pose Estimation Unit 422 is a series of labels, each of which identifies one of several potential actions that could have been performed by the $i^{th}$ person at time t. In this way, the series of labels identifies the actions performed by the $i^{th}$ person at different points of time during their work in the warehouse.

In an embodiment, the Pattern Analyser 426 is configured to receive action labels from the Human Pose Estimation Unit 422, product labels from the Merchandise Classification Unit 424 and trajectories of detected Risk Subjects from the Trajectory Computation Unit 420. The Pattern Analyser 426 is configured to use internal logic elements to process the above-mentioned received information, to detect patterns of movement and activities undertaken by individual persons, stock items, pallets and equipment in the warehouse, wherein these patterns are consistent with the identified predefined risks and heuristic risks of the warehouse.

In an embodiment of the present disclosure, the Monitored Zones may have a numbering scheme based on identifiers of video sensors positioned to capture video footage in the respective monitored zones. Alternatively, the Monitored Zones may have a fixed numbering scheme (independent of the route taken by a warehouse operator) according to the requirements of the warehouse managers.

In entirety, the NERD component 408 processes the video data captured by the array of video sensors (404*a* till 404*f*) to create new heuristic risk types. Using this, a corresponding risk instance may be created based on observations of different process anomalies in each Monitored Zone and/or Uncovered Zone along the Operator Route.

In an example, a risk of excessive time spent by operator in a particular zone of the warehouse may be determined by comparing the time interval spent by an operator in the various Monitored Zones and/or Uncovered Zones along the Operator Route 420, against an expected "normal" time interval spent in the relevant warehouse zone. This risk may indicate the slowing-down of an activity/process undertaken in the warehouse zone. The "normal" time interval spent in the warehouse zone may be estimated as an average of the time intervals spent therein during a past pre-defined number of weeks. Also, the "normal" time interval may be estimated by observing a predefined number of the instances of the process performed in the relevant warehouse zone. Alternatively, the "normal" time interval may be estimated by calculating the average time spent in each Monitored Zone and/or Uncovered Zone along the Operator Route 420 during a pre-defined number (N) of previous days. For this risk type, a rule for updating the trigger could be "Update the Warehouse Risk Map 210 in FIG. 2B) every time the NERD component 408 detects excessive time being repeatedly spent in a Monitored Zone and/or Uncovered Zone". The NERD component 408 creates the risk instances for heuristic risks and implements an update process through the activation of triggers in an analogous manner to that described for pre-defined risks. For the example mentioned above, the trigger can be activated according to the measured time interval spent by an operator in a given warehouse zone.

In another example, warehouse zones where risk incidents occur frequently, may be discovered by establishing a threshold for the number of process interruptions caused by the occurrence of various uncategorized/unknown incidents in Monitored Zones and/or Uncovered Zones. Such incidents may be reported by a warehouse manager, and may, for example, be caused by overly narrow aisles/spacing between racks, preventing items from being packed securely in the racks, so that packages fall from the rack. For this risk type, a rule for an update trigger could be "Update the Warehouse Risk Map (210 in FIG. 2B) every time a manager reports a new incident in a relevant Monitored Zone and/or Uncovered Zone". The NERD component 408 detects the risk by automatically parsing manager reports to count the number of reported incidents according to the warehouse zones in which the incidents occurred. On detection of an excessive number of reported incidents in a given warehouse zone, the NERD component 408 creates a new risk instance, with a risk type attribute set to "Bermuda Triangle"; and the location of the risk set to the identifier of the relevant warehouse zone. The NERD component 408 then updates the Warehouse Risk Map (210 in FIG. 2B) to include the created risk instance.

Thus, identification of risk areas allows the warehouse managers/operators to quickly take remedial action to address the cause thereof. More importantly, informed decision-making regarding pro-active measures may be taken including redesigning aspects of the warehouse to prevent or minimize the effect of the risk factors. The redesigning aspects may include redefining and/or improving manipulation procedures, redesigning the physical and logistics aspects of the warehouse environment, improving packing/stacking criteria, planning better order pickers routes, implementing enhanced (environmental and operator) monitoring etc.

Figure 5:
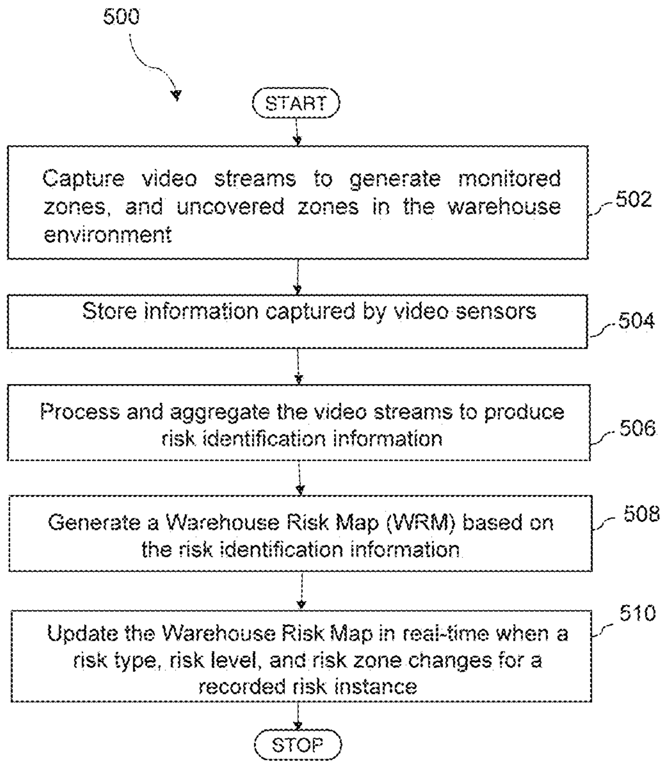
FIG. 5 is a flowchart illustrating a method for identifying and managing areas of risk in the warehouse environment, in accordance with an embodiment of the present disclosure.

FIG. 5 is a flowchart 500 illustrating a method for identifying and managing areas of risk in a warehouse environment of FIGS. 1A and 4A, in accordance with an embodiment of the present disclosure. This method, and each method described herein, may be implemented by the architectures described herein. Of by other architectures. The method is illustrated as a collection of blocks in a logical flow graph. Some of the blocks represent operations that can be implemented in hardware, software, or a combination thereof. In the context of software, the blocks represent computer-executable instructions stored on one or more computer readable media that, when executed by one or more processors, perform the recited operations. Generally, computer-executable instructions include routines, programs, objects, components, data structures, and the that perform particular functions or implement particular abstract data types.

The computer readable media may include non-transitory computer readable storage media, which may include hard drives, floppy diskettes, optical disks, CD-ROMs, DVDs, read-only memories (ROMs), random access memories (RAMS), EPROMs, EEPROMs, flash memory, magnetic or optical cards, solid-state memory devices, or other types of storage media suitable for storing electronic instructions. In addition, in some implementations, the computer readable media may include a transitory computer readable signal (in compressed or uncompressed form). Examples of computer readable signals, whether modulated using a carrier or not, include but are not limited to, signals that a computer system hosting or running a computer program can be configured to access, including signals downloaded through the Internet or other networks. Finally, the order in which the operations are described is not intended to be construed as a limitation, and any number of the described operations can be combined in any order and/or in parallel to implement the process.

At step 502, each Field of View of one or more video sensors installed in a warehouse environment are used to generate one or more Monitored Zones, and one or more Uncovered Zones therein. The one or more sensors have a Field of View that corresponds to a spatial volume in which the presence of objects may be detected in the absence of obstructions that would otherwise conceal the object. In the context of the present disclosure, the Field of View also covers an Operator Route, where the Operator Route is defined as the path traversed by a warehouse operator during the during a task period, and the task period is defined as the time period extending from the moment the operator receives a task list from the supervisor until she/he has finished all the tasks on the task list. It should be noted that a task on the task list may include multiple operations such as a handling, order-filling, pallet-loading/unloading, and rack-filling. At step 504, information comprising video streams captured by each video sensor is stored.

At step 506, each of the video streams are processed and aggregated to produce information regarding risk instances associated with an Operator Route followed by a warehouse operator while performing a warehouse operation, wherein the risk identification information includes at least one risk zone, and corresponding risk type, and risk level, wherein a risk zone is an area in the warehouse environment that corresponds to one or more risk instances. In an embodiment of the present disclosure, the warehouse operation is selected from at least one of: a handling task, an order filling task, a pallet loading/unloading task, and a rack filling task. A risk is selected from at least one of: a predefined risk arising from a heavy package, a predefined risk arising from a fragile package and a heuristic risk. In an embodiment of the present disclosure, the occurrence of one or more predefined risks is detected, and the location of each risk is marked on a Warehouse Risk Map to thereby illustrate corresponding risk instances. In an example, the pre-defined risk includes a risk arising from heavy packages, the location of the said risk is determined from an inventory list, and the corresponding Warehouse Risk Map is updated, each time the inventory list changes.

In an embodiment of the present disclosure, one or more heuristic risks are determined by comparing the time spent by the operator, object handling actions, and the operator's movement pattern with a corresponding pre-defined time spent by the operator, a pre-defined object handling action, and a pre-defined operator movement pattern.

At step 508, a Warehouse Risk Map is generated based on the risk instances information, wherein the Warehouse Risk Map is generated by superimposing an identified risk zone on a two-dimensional map of an observed warehouse environment. The superimposing risk zones are partially overlapped zones (areas) on the map which corresponds to two different risk instances such as first and second racks. The Warehouse Risk Map is used to optimize the spatial deployment of video cameras in the warehouse environment so that their collective Field of View cover all the locations associated with each risk instance.

At step 510, the Warehouse Risk Map is updated in real-time when at least one of the risk type, risk level, and risk zone changes for at least one risk instance recorded on the Warehouse Risk Map. In an embodiment of the present disclosure, a risk level for a risk zone is computed based on probability of a particular risk incident happening at the risk zone, the risk level including two components, a recent risk level, and a global risk level, where the recent risk level expresses a number of risk incidents that recently occurred in the risk zone as a fraction of total number of operations undertaken in the risk zone, and the global risk level expresses a total number of occurrences of risk incidents in the risk zone as a fraction of the total number of operations undertaken.

Figure 6:
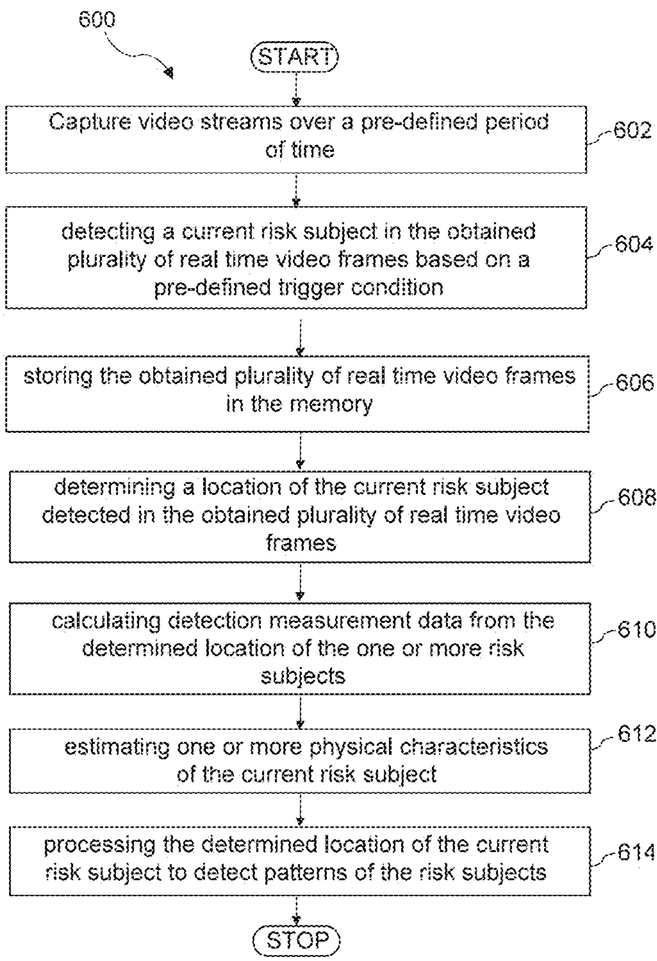
FIG. 6 is a flowchart illustrating a method for identifying risks in the warehouse environment, in accordance with an embodiment of the present disclosure.

FIG. 6 is a flowchart 600 illustrating a method for identifying and managing areas of risk in a warehouse environment of FIGS. 1A and 4D, in accordance with an embodiment of the present disclosure. This method, and each method described herein, may be implemented by the architectures described herein or by other architectures. The method is illustrated as a collection of blocks in a logical flow graph. Some of the blocks represent operations that can be implemented in hardware, software, or a combination thereof, in the context of software, the blocks represent computer-executable instructions stored on one or more computer readable media that when executed by one or more processors, perform the recited operations, Generally, computer-executable instructions include routines, programs, objects, components, data structures, and the like that perform particular functions or implement particular abstract data types.

The computer readable media may include non-transitory computer readable storage media, which may include hard drives, floppy diskettes, optical disks, CD-ROMs, DVDs, read-only memories (ROMs), random access memories (RAMs), EPROMs, EEPROMs, flash memory, magnetic or optical cards, solid-state memory devices, or other types of storage media suitable for storing electronic instructions. In addition, in some implementations, the computer readable media may include a transitory compute: readable signal (in compressed or uncompressed form). Examples of computer readable signals, whether modulated using a carrier or not., include, but are not limited to, signals that a computer system hosting or running a computer program can be configured to access, including signals downloaded through the Internet or other networks. Finally, the order in which the operations are described is not intended to be construed as a limitation, and any number of the described operations can be combined in any order and/or in parallel to implement the process.

In an embodiment, the method may include a first step 602 of obtaining a plurality of video frames over a pre-defined period of time using one or more video sensors. The plurality of video frames may relate to one or more Monitored Zones, and one or more Uncovered Zones therein.

In an embodiment, the method may include a next step 604 of configuring a risk discovery unit, i.e. a New Emerging Risk Discovery (NERD) component 408 to the plurality of video sensors. In this embodiment, the New Emerging Risk Discovery (NERD) component 408 is configured to the central processing unit (CPU) 201, and the CPU 201 is communicably coupled to the plurality of video sensors. The (NERD) component 408 is configured to execute:

The next step 606 of the method, which comprises detecting a current risk subject in the plurality of real time video frames. The current risk subject is detected on the basis of a trigger condition comprising risk instances which may be associated with the current risk subject. The current risk subject is one of a person, pallets and packages visible in the plurality of video frame.

The next step 608 of the method, which comprises determining a location of the current risk subject detected in the obtained plurality of real time video frames. The location comprises location coordinates of the risk subject in the plurality of the video frame. The location coordinates are determined by a bounding box or an area of interest formed in the plurality of video frames. Based on the location of the determined risk subject, the next step 610 of the method is executed, which comprises calculating the detection measurement data of the one or more risk subjects.

The next step 612 of the method, which comprises estimating one or more physical characteristics of the current risk subject. The physical characteristics are related to various pose formed by 16 important points of the human skeleton, namely, right/left ankle, right/left knee, right/left hip, pelvis, thorax, upper neck, head top, right/left wrist, right/left shoulder, right/left elbow. The movement related to the pose are to classify the action formed within a pre-defined period of time.

The next 614 of the method, in which the classified action is received, and along with the determined location, patterns or movement of the current risk subjects are detected.

Modifications to embodiments of the present disclosure described in the foregoing are possible without departing from the scope of the present disclosure as defined by the accompanying claims. Expressions such as "including", "comprising", "incorporating", "consisting of", "have", "is" used to describe and claim the present disclosure are intended to be construed in a non-exclusive manner, namely allowing for items, components or elements not explicitly described also to be present. Reference to the singular is also to be construed to relate to the plural.

What is claimed is:

1. A computer implemented method for identifying and mitigating risks in a warehouse environment, the method comprising:

obtaining a plurality of real time video frames over a pre-defined period of time using a plurality of video sensors;

configuring a risk discovery unit by a central processing unit communicably coupled to the plurality of video sensors and a memory for:

detecting a current risk subject including at least one of a person, a pallet and a package in the obtained plurality of real time video frames based on activation of one or more pre-defined trigger conditions, and wherein the detected risk subjects are subjects having associated therewith at least one of a predefined risk known beforehand and a heuristic risk previously unknown;

storing the obtained plurality of real time video frames in the memory;

determining a location of the current risk subject detected in the obtained plurality of real time video frames;

calculating, by a trajectory computation unit, detection measurement data from the determined location of the one or more risk subjects;

cropping, by the trajectory computation unit, the plurality of real time video frames based on the calculated detection measurement data to extract detection appearance data of the current risk subject;

retrieving, by a Kalman filter unit of the trajectory computation unit, the detection measurement data and a previous state data of a previously detected risk subject stored in a previous state database, and calculating therefrom a predicted state data and an actual measurement data for the current risk subject;

calculating, by a matcher unit of the trajectory computation unit, a first distance between the actual measurement data and the predicted state data and implementing a thresholding function on the first distance to form a state indicator data;

calculating, by the matcher unit, a second distance between the detection appearance data of the current risk subject and a previous appearance data stored in tracklet data of a tracking database and implementing a thresholding function on the second distance to form an appearance indicator data;

calculating, by a Hungarian unit of the trajectory computation unit, an association data based on a product of the state indicator data and the appearance indicator data, and matching a current detection of the risk subject to the tracklet data when the association data equals a pre-defined value to form a set of first matching indices and second matching indices linking the current detection of the risk subject to a corresponding tracklet vector in the tracking database:

estimating a multi-point skeletal pose of the current risk subject using a human pose estimation unit, and classifying one or more actions performed by the current risk subject based on the estimated skeletal pose over a pre-defined time window;

processing, by a pattern analysis unit communicably coupled to the trajectory computation unit and the human pose estimation unit, the determined location of the current risk subject to detect patterns or movements and activities undertaken by one or more risk subjects; and providing actionable insights to warehouse managers to take one or more remedial actions for preventing, or at least minimizing, an effect associated with risk factors identified for the one or more risk subjects and for addressing a cause thereof by generating and providing to the warehouse managers at least one of:

a redesigned physical and logistics plan of the warehouse;

a redefined manipulation procedure to be performed by, or on, the risk subjects;

an improved packing and stacking criteria over an existing packing and stacking criteria for the risk subject;

alternative order pickers routes that are different from existing order pickers routes; and an enhanced warehouse environment and operator monitoring protocol different from an existing environmental and operator monitoring protocol.

2. The computer implemented method of claim 1, wherein the trajectory computation unit further comprises a data updating unit coupled to the Hungarian unit, the data updating unit configured for:

transmitting actual measurement data along with a first set of matching instructions to the previous state database when the actual measurement data matches the first set of matching data, wherein the first set of matching instructions are configured for activating the Kalman filter unit for computing a new predicted state data using the previous state data; and transmitting the detected appearance data along with a second set of instructions to a tracking database when the detected appearance data matches the first set of matching data, wherein the detected appearance data is stored in the tracklet data based on the second set of instructions.

3. A computer implemented system for identifying and mitigating risks in a warehouse environment, the computer implemented system comprising:

a plurality of video sensors configured to obtain a plurality of real time video frames over a pre-defined period of time;

a central processing unit coupled to the plurality of video sensors, wherein the central processing unit is configured with:

a risk discovery unit configured to:

detect a current risk subject including at least one of a person, a pallet and a package in the obtained plurality of real time video frames based on activation of one or more pre-defined trigger conditions, wherein the risk subject is one of a person, pallets and packages visible in the plurality of video frames, and wherein the detected risk subject is a subject having associated therewith at least one of a pre-defined risk known beforehand and a heuristic risk previously unknown;

store the obtained plurality of real time video frames in a memory; and determine a location of the current risk subject detected in the obtained plurality of real time video frames;

a trajectory computation unit comprising:

a previous state database configured to store a previous state data derived from observing a previously detected risk subject from a first video frame obtained from the plurality of real time video frames;

a Kalman filter unit configured to retrieve detection measurement data calculated from the determined location of the one or more risk subjects, and a previous state data of the previously detected risk subject from the previous state database, and calculate therefrom a predicted state data and an actual measurement data of the current risk subject;

a tracking database communicatively coupled to the Kalman filter unit and configured to store tracklet data associated with previously detected risk subjects, wherein the tracklet data comprises a previous appearance data of the previously detected risk subjects;

a matcher unit communicatively coupled to the Kalman filter unit and configured to: (i) calculate a first distance between the actual measurement data and the predicted state data and implement a thresholding function on the first distance to form a state indicator data; and (ii) calculate a second distance between a detection appearance data of the current risk subject and the previous appearance data of the tracklet data and implement a thresholding function on the second distance to form an appearance indicator data; and a Hungarian unit communicatively coupled to the matcher unit and configured to calculate an association data based on a product of the state indicator data and the appearance indicator data, and match a current detection of the risk subject to the tracklet data when the association data equals a pre-defined value to form a set of first matching indices and second matching indices linking the current detection of the risk subject to a corresponding tracklet vector in the tracking database;

a human pose estimation unit configured to estimate a multi-point skeletal pose of the current risk subject from the plurality of real time video frames and classify one or more actions performed by the current risk subject based on the estimated skeletal pose over a pre-defined time window; and a pattern analysis unit communicably coupled to the trajectory computation unit and the human pose estimation unit and configured to process the determined location of the current risk subject to detect patterns or movements and activities undertaken by one or more risk subjects; and wherein the central processing unit is further configured to provide actionable insights to warehouse managers to take one or more remedial actions for preventing, or at least minimizing, an effect associated with risk factors identified for the one or more risk subjects and for addressing a cause thereof by generating and providing to the warehouse managers at least one of:

a redesigned physical and logistics plan of the warehouse;

a redefined manipulation procedure to be performed by, or on, the risk subjects;

an improved packing and stacking criteria over an existing packing and stacking criteria for the risk subject;

alternative order pickers routes that are different from existing order pickers routes; and an enhanced warehouse environment and operator monitoring protocol different from an existing environmental and operator monitoring protocol.

4. The computer implemented system of claim 3, wherein the trajectory computation unit further comprises a data updating unit coupled to the Hungarian unit configured to:

transmit actual measurement data along with a first set of matching instructions to the previous state database when the actual measurement data matches the first set of matching data, wherein the first set of matching instructions are configured for activating the Kalman filter unit for computing a new predicted state data using the previous state data; and transmit the detected appearance data along with a second set of instructions to the tracking database when the detected appearance data matches the first set of matching data, wherein the detected appearance data is stored in the tracklet data based on the second set of instructions.

5. A non-transitory computer-readable medium for identifying and mitigating risks in a warehouse environment, the non-transitory computer-readable medium comprising a set of instructions, the set of instructions when executed by a processor causes the processor to:

detect a current risk subject including at least one of a person, a pallet and a package in a plurality of real time video frames, and wherein the detected risk subject is a subject having associated therewith at least one of a predefined risk known beforehand and a heuristic risk previously unknown;

store the plurality of real time video frames in a memory;

determine a location of the current risk subject detected in the plurality of real time video frames;

crop the plurality of real time video frames based on calculated detection measurement data derived from the determined location of the current risk subject to extract detection appearance data of the current risk subject;

retrieve, using a Kalman filter unit, the detection measurement data and a previous state data of a previously detected risk subject stored in a previous state database, and calculate therefrom a predicted state data and an actual measurement data for the current risk subject;

calculate, using a matcher unit, a first distance between the actual measurement data and the predicted state data and apply a thresholding function on the first distance to form a state indicator data, and calculate a second distance between the detection appearance data of the current risk subject and a previous appearance data stored in tracklet data of a tracking database and apply a thresholding function on the second distance to form an appearance indicator data;

calculate, using a Hungarian unit, an association data based on a product of the state indicator data and the appearance indicator data, and match a current detection of the risk subject to the tracklet data when the association data equals a pre-defined value to form a set of first matching indices and second matching indices linking the current detection of the risk subject to a corresponding tracklet vector in the tracking database;

estimate a multi-point skeletal pose of the current risk subject using a human pose estimation unit, and classify one or more actions performed by the current risk subject based on the estimated skeletal pose over a pre-defined time window;

process, using a pattern analysis unit communicably coupled to the trajectory computation unit and the human pose estimation unit, the determined location of the current risk subject to detect patterns or movements and activities undertaken by one or more risk subjects; and provide actionable insights to warehouse managers to take one or more remedial actions for preventing, or at least minimizing, an effect associated with risk factors identified for the one or more risk subjects and for addressing a cause thereof by generating and providing to the warehouse managers at least one of:

a redesigned physical and logistics plan of the warehouse;

a redefined manipulation procedure to be performed by, or on, the risk subjects;

an improved packing and stacking criteria over an existing packing and stacking criteria for the risk subject;

alternative order pickers routes that are different from existing order pickers routes; and an enhanced warehouse environment and operator monitoring protocol different from an existing environmental and operator monitoring protocol.

6. The computer implemented method of claim 1, further comprising:

maintaining continuity of tracking of the current risk subject across successive video frames and across consecutive monitored zones monitored by the plurality of video sensors based on the set of first matching indices and second matching indices formed by the Hungarian unit from the association data derived from the state indicator data of the Kalman filter unit and the appearance indicator data of the matcher unit; and generating a warehouse risk map by superimposing one or more identified risk zones on a two-dimensional map of the warehouse environment, and updating the warehouse risk map in real-time when at least one of a risk type, risk level, or risk zone changes for a risk instance recorded on the warehouse risk map, wherein the risk type, risk level, and risk zone are determined based on the continuity of tracking of the current risk subject maintained across the plurality of video sensors.

7. The computer implemented method of claim 1, wherein the trajectory computation unit further comprises a video knowledge distillation (VKD) unit comprising a Teacher Network and a Student Network, each having a residual neural network (ResNet) convolutional neural network architecture with a bottleneck attention module, wherein prior to operation: the Teacher Network is trained on a first subset of Concatenated Video Frames comprising video frames captured simultaneously by the plurality of video sensors to establish an internal representation of the appearance of a risk subject; and the Student Network is trained from the Teacher Network in a self-distillation mode using a second subset of Concatenated Video Frames comprising fewer Concatenate Members than the first subset; and wherein during operation, the Student Network is configured to process a cropped region of the current risk subject to produce a detected appearance vector representing the appearance attributes of the current risk subject.

8. The computer implemented method of claim 7, wherein the Student Network is trained using a cost function comprising a weighted sum of a triplet loss term, a classification loss term, a knowledge distillation loss term expressing a cross-entropy loss between identifiers returned by the Teacher Network and identifiers returned by the Student Network in response to the same risk subject, and an L2 distance term expressing the distance between an internal representation formed in the Teacher Network and an internal representation formed in the Student Network.

9. The computer implemented method of claim 1, wherein the human pose estimation unit is further configured to: apply single-person pose estimation using a neural network architecture that incorporates historical information to estimate joints in the presence of blurring or occlusion; detect a human pose defined by sixteen skeletal joint points comprising right and left ankle, right and left knee, right and left hip, pelvis, thorax, upper neck, head top, right and left wrist, right and left shoulder, and right and left elbow; and post-process the estimated human pose using a time-based sliding window of interval to extract one or more actions corresponding to body joint trajectories over the interval, wherein the one or more actions are selected from squatting, bending, reaching, picking, dropping, and throwing.

10. The computer implemented method of claim 1, wherein obtaining the plurality of real time video frames comprises concatenating individual video frames captured simultaneously by the plurality of video sensors at a same sampling time to form a concatenated video frame, and wherein the trajectory computation unit is configured to process the concatenated video frame to detect and track risk subjects across the fields of view of the plurality of video sensors simultaneously.

11. The computer implemented method of claim 1, further comprising:

generating a warehouse risk map by superimposing one or more identified risk zones on a two-dimensional map of the warehouse environment; and updating the warehouse risk map in real-time upon activation of one or more risk-type-specific triggers, wherein each trigger is specifically linked to a corresponding risk type such that the warehouse risk map is updated when at least one of a risk type, risk level, or risk zone changes for a risk instance recorded on the warehouse risk map.

12. The computer implemented method of claim 1, further comprising detecting package integrity using a package integrity check AI (PICAI) unit comprising a trained deep neural network classifier configured to process a video stream from a video sensor positioned to monitor the warehouse environment and classify packages visible in the video stream as one of damaged or non-damaged, wherein the PICAI unit is configured to trigger an update to a warehouse risk map upon detection of a damaged package.

13. The computer implemented method of claim 12, wherein the trained deep neural network classifier of the PICAI unit implements one of a visual geometry group (VGG) architecture or a residual neural network (ResNet) architecture, and wherein the classifier is trained on a set of images labeled into two classes comprising damaged packages and non-damaged packages.

14. The computer implemented system of claim 11, wherein the central processing unit is further configured to:

maintain continuity of tracking of the current risk subject across successive video frames and across fields of view of the plurality of video sensors based on the set of first matching indices and second matching indices formed by the Hungarian unit from the association data derived from the state indicator data of the Kalman filter unit and the appearance indicator data of the matcher unit;

generate a warehouse risk map by superimposing one or more identified risk zones corresponding to the current risk subject on a two-dimensional map of the warehouse environment; and update the warehouse risk map in real-time when at least one of a risk type, risk level, or risk zone changes for at least one risk instance recorded on the warehouse risk map, wherein the risk type, risk level, and risk zone are determined based on the persistent identity of the current risk subject maintained across the plurality of video sensors.

15. The computer implemented system of claim 3, wherein the central processing unit is further configured to:

generate a warehouse risk map by superimposing one or more identified risk zones on a two-dimensional map of the warehouse environment; and update the warehouse risk map in real-time upon activation of one or more risk-type-specific triggers, wherein each trigger is specifically linked to a corresponding risk type such that the warehouse risk map is updated when at least one of a risk type, risk level, or risk zone changes for a risk instance recorded on the warehouse risk map.

16. The computer implemented system of claim 3, wherein obtaining the plurality of real time video frames comprises concatenating individual video frames captured simultaneously by the plurality of video sensors at a same sampling time to form a concatenated video frame, and wherein the trajectory computation unit is configured to process the concatenated video frame to detect and track risk subjects across the fields of view of the plurality of video sensors simultaneously.

17. The non-transitory computer-readable medium of claim 5, wherein the set of instructions when executed by the processor further causes the processor to:

maintain continuity of tracking of the current risk subject across successive video frames and across fields of view of a plurality of video sensors based on the set of first matching indices and second matching indices formed by the Hungarian unit from the association data derived from the state indicator data of the Kalman filter unit and the appearance indicator data of the matcher unit;

generate a warehouse risk map by superimposing one or more identified risk zones corresponding to the current risk subject on a two-dimensional map of the warehouse environment; and update the warehouse risk map in real-time when at least one of a risk type, risk level, or risk zone changes for at least one risk instance recorded on the warehouse risk map, wherein the risk type, risk level, and risk zone are determined based on the persistent identity of the current risk subject maintained across the plurality of video sensors.

18. The non-transitory computer-readable medium of claim 5, wherein the set of instructions when executed by the processor further causes the processor to:

transmit actual measurement data along with a first set of matching instructions to the previous state database when the actual measurement data matches the first set of matching data, wherein the first set of matching instructions are configured for activating the Kalman filter unit for computing a new predicted state data using the previous state data; and transmit the detected appearance data along with a second set of instructions to the tracking database when the detected appearance data matches the first set of matching data, wherein the detected appearance data is stored in the tracklet data based on the second set of instructions.

19. The non-transitory computer-readable medium of claim 5, wherein the set of instructions when executed by the processor further causes the processor to:

generate a warehouse risk map by superimposing one or more identified risk zones on a two-dimensional map of the warehouse environment; and update the warehouse risk map in real-time upon activation of one or more risk-type-specific triggers, wherein each trigger is specifically linked to a corresponding risk type such that the warehouse risk map is updated when at least one of a risk type, risk level, or risk zone changes for a risk instance recorded on the warehouse risk map.

20. The non-transitory computer-readable medium of claim 5, wherein the plurality of real time video frames are formed by concatenating individual video frames captured simultaneously by a plurality of video sensors at a same sampling time to form a concatenated video frame, and wherein the trajectory computation unit is configured to process the concatenated video frame to detect and track risk subjects across the fields of view of the plurality of video sensors simultaneously.

* * * * *